(12) United States Patent
Burns et al.

(10) Patent No.: US 9,779,944 B1
(45) Date of Patent: Oct. 3, 2017

(54) METHOD AND STRUCTURE FOR CUT MATERIAL SELECTION

(71) Applicant: International Business Machines Corporation, Armonk, NY (US)

(72) Inventors: Sean D. Burns, Hopewell Junction, NY (US); Lawrence A. Clevenger, LaGrangeville, NY (US); Matthew E. Colburn, Schenectady, NY (US); Nelson M. Felix, Briarcliff Manor, NY (US); Sivananda K. Kanakasabapathy, Niskayuna, NY (US); Yann A. M. Mignot, Slingerlands, NY (US); Christopher J. Penny, Saratoga Springs, NY (US); Roger A. Quon, Rhinebeck, NY (US); Nicole A. Saulnier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/263,959

(22) Filed: Sep. 13, 2016

(51) Int. Cl.
*H01L 21/311* (2006.01)
*H01L 21/033* (2006.01)

(52) U.S. Cl.
CPC ...... *H01L 21/0338* (2013.01); *H01L 21/0337* (2013.01); *H01L 21/31144* (2013.01)

(58) Field of Classification Search
CPC ............ H01L 21/0338; H01L 21/0337; H01L 21/31144
See application file for complete search history.

(56) References Cited

U.S. PATENT DOCUMENTS

| | | | |
|---|---|---|---|
| 7,776,744 B2 | 8/2010 | Sandhu et al. | |
| 8,404,592 B2 | 3/2013 | Luning et al. | |
| 8,415,089 B1 | 4/2013 | Gupta et al. | |
| 8,907,497 B2 | 12/2014 | Chang et al. | |
| 9,087,792 B2 | 7/2015 | Cheng et al. | |
| 9,099,314 B2 | 8/2015 | Sandhu et al. | |
| 9,230,809 B2 | 1/2016 | Chang et al. | |
| 9,269,590 B2 | 2/2016 | Luere et al. | |
| 2013/0065397 A1 | 3/2013 | Chen | |
| 2014/0367833 A1 | 12/2014 | Brink et al. | |
| 2015/0056724 A1* | 2/2015 | Shieh | H01L 22/12 438/14 |
| 2015/0076704 A1 | 3/2015 | Song et al. | |
| 2015/0137204 A1* | 5/2015 | Wang | H01L 27/11524 257/314 |
| 2015/0380300 A1 | 12/2015 | Wu et al. | |
| 2016/0372334 A1* | 12/2016 | Mignot | H01L 21/31116 |

FOREIGN PATENT DOCUMENTS

CN 103779263 A 5/2014
WO 2015047321 A1 4/2015

* cited by examiner

*Primary Examiner* — Bradley K Smith
(74) *Attorney, Agent, or Firm* — Louis J. Percello; Ryan, Mason & Lewis, LLP

(57) ABSTRACT

A method for manufacturing a semiconductor device includes forming a plurality of mandrels on a dielectric layer, conformally depositing a spacer layer on the plurality of mandrels, removing a portion of the spacer layer from a top surface of at least one of the plurality of mandrels, removing the at least one of the plurality of mandrels to create at least one opening, and filling the at least opening with a cut fill material, wherein the cut fill material comprises the same material as a material of the spacer layer.

19 Claims, 24 Drawing Sheets

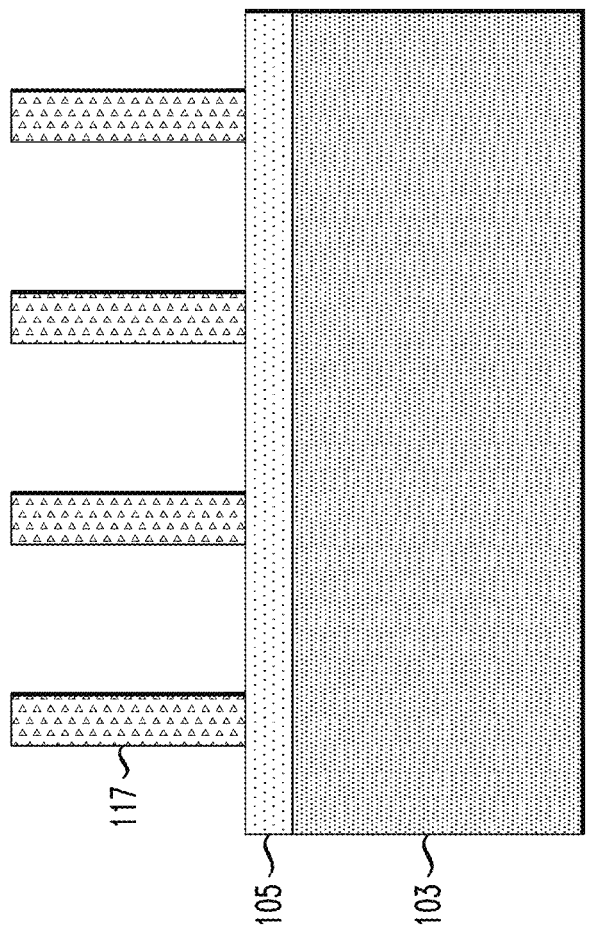
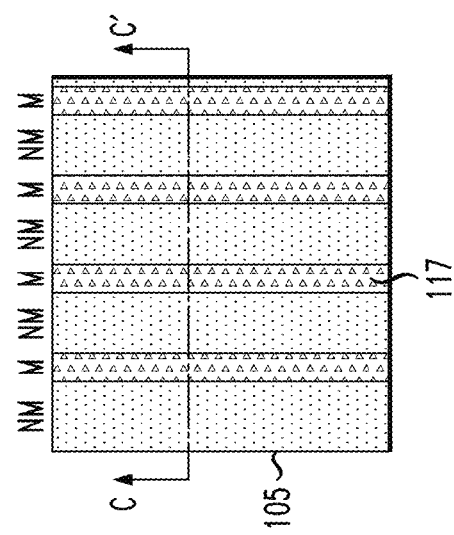

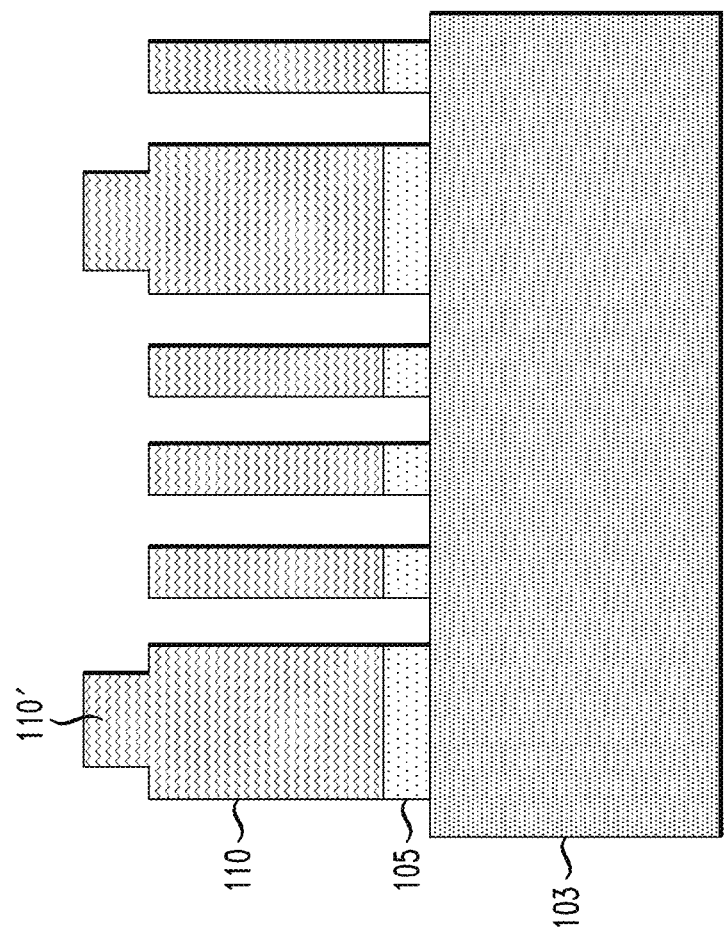
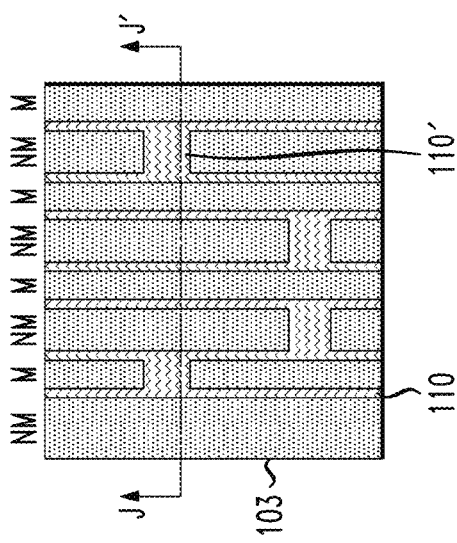
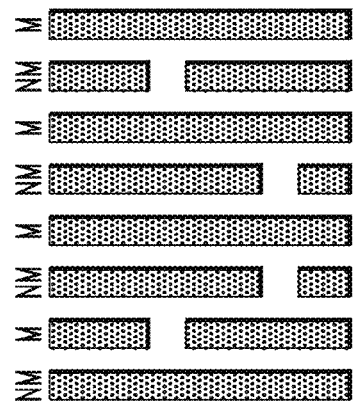

METHOD AND STRUCTURE FOR CUT MATERIAL SELECTION

TECHNICAL FIELD

The field generally relates to semiconductor devices and methods of manufacturing same and, in particular, to using cut fill materials for patterning that match a spacer material in order to reduce a number of mutually selective materials needed for processing.

BACKGROUND

Self-Aligned Doubled Patterning (SADP) is a type of multiple patterning used for manufacturing integrated circuits (ICs), which utilizes spacers to enhance feature density. A spacer is a layer formed on a sidewall of a patterned feature, such as, for example, a mandrel. During an SADP process, spacer layers can be removed from horizontal surfaces, leaving the layers on the sidewalls, followed by removal of the patterned feature. This results in the line density being doubled because there are two spacers for every line. SADP can be useful, for example, to define narrow gates at half an original lithographic pitch.

Line edge roughness (LER) refers to a deviation of an edge of an element in a semiconductor device from a smooth shape. LER can degrade device performance by causing variations in line width, resulting in variations in critical dimension (CD) with scaling to smaller dimensions. CD uniformity (CDU) control across a wafer is becoming increasingly difficult with increased miniaturization.

Scanner overlay refers to a scanner's ability to accurately align and print layers on top of each other. With reductions in size, overlay errors that impact chip performance and yield are more likely. For example, it has become increasingly difficult to selectively pattern lines without patterning adjacent lines. Current via self-alignment strategies allow better CD and overlay control by limiting via printing to within trenches. However, scanner overlay and patterning processes are not scaling as fast as line pitch. Some approaches to increase CDU and reduce LER are being researched, but these approaches fail to identify material sets that can be etched selectively to one another.

SUMMARY

According to an exemplary embodiment of the present invention, a method for manufacturing a semiconductor device includes forming a plurality of mandrels on a dielectric layer, conformally depositing a spacer layer on the plurality of mandrels, removing a portion of the spacer layer from a top surface of at least one of the plurality of mandrels, removing the at least one of the plurality of mandrels to create at least one opening, and filling the at least opening with a cut fill material, wherein the cut fill material comprises the same material as a material of the spacer layer.

According to an exemplary embodiment of the present invention, a method for manufacturing a semiconductor device includes forming a hardmask layer on a dielectric layer, depositing an organic layer on the hardmask layer, patterning the organic layer into a plurality of mandrels, conformally depositing a spacer layer on the plurality of mandrels, removing a portion of the spacer layer from a top surface of at least one of the plurality of mandrels, removing the at least one of the plurality of mandrels to create at least one opening, filling the at least opening with a cut fill material, wherein the cut fill material comprises the same material as a material of the spacer layer, and selectively etching a portion of the hardmask layer simultaneously with respect to the spacer layer and the cut fill material.

According to an exemplary embodiment of the present invention, a method for manufacturing a semiconductor device includes forming a plurality of mandrels spaced apart from each other on a dielectric layer, conformally depositing a spacer layer on the plurality of mandrels, wherein the spacer layer occupies a portion of each of a plurality of gaps between adjacent mandrels, depositing an organic fill material on the spacer layer, wherein the organic fill material blocks one or more of the plurality of gaps, and depositing a cut fill material in a remaining portion of one or more exposed gaps of the plurality of gaps, wherein the cut fill material comprises the same material as a material of the spacer layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 3A is a top view and FIG. 3B is a cross-sectional view taken along line C-C' of FIG. 3A illustrating fabrication of a semiconductor device and showing patterning of mandrels and removal of the photoresists, according to an exemplary embodiment of the present invention.

FIG. 10A is a top view and FIG. 10B is a cross-sectional view taken along line J-J' of FIG. 10A illustrating fabrication of a semiconductor device and showing removal of portions of the mask layer, according to an exemplary embodiment of the present invention.

FIG. 10C is a top schematic view showing a designed pattern including mandrel and non-mandrel portions, according to an exemplary embodiment of the present invention.

DETAILED DESCRIPTION

Figure 1B:
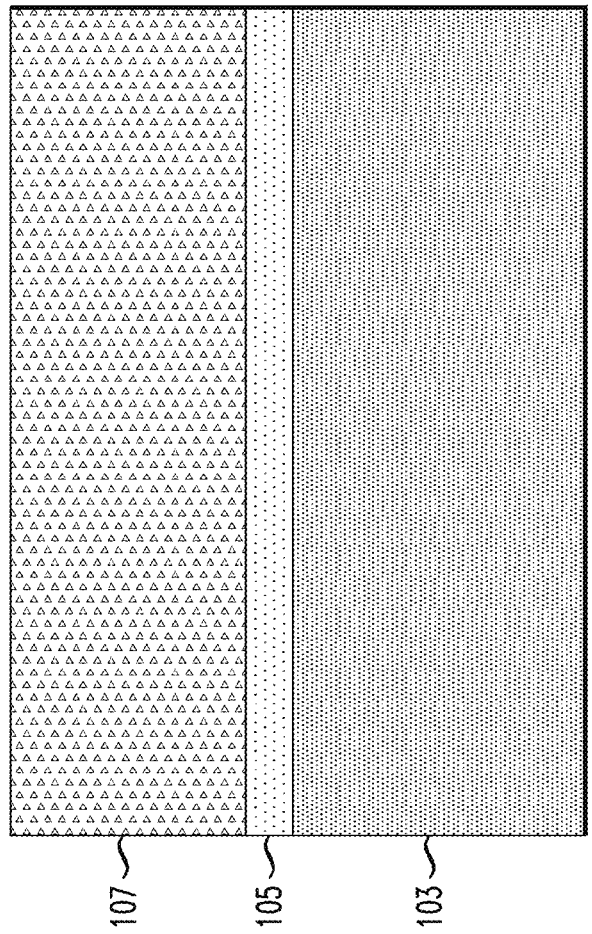
FIG. 1A is a top view and FIG. 1B is a cross-sectional view taken along line A-A' of FIG. 1A illustrating fabrication of a semiconductor device and showing a mandrel material layer formed on dielectric and mask layers, according to an exemplary embodiment of the present invention.

Exemplary embodiments of the invention will now be discussed in further detail with regard to semiconductor devices and methods of manufacturing same and, in particular, to using cut fill materials for patterning that match a spacer material in order to reduce a number of mutually selective materials needed for processing.

It is to be understood that the various layers and/or regions shown in the accompanying drawings are not drawn to scale, and that one or more layers and/or regions of a type commonly used in, for example, complementary metal-oxide semiconductor (CMOS), fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, CMOSs, MOSFETs and/or FinFETs. By way of non-limiting example, the semiconductor devices can include, but are not limited to CMOS, MOSFET and FinFET devices, and/or semiconductor devices that use CMOS, MOSFET and/or FinFET technology.

As used herein, "height" refers to a vertical size of an element (e.g., a layer, trench, hole, etc.) in the cross-sectional views measured from a bottom surface to a top surface of the element, and/or measured with respect to a surface on which the element is directly on. Conversely, a "depth" refers to a vertical size of an element (e.g., a layer, trench, hole, etc.) in the cross-sectional and three-dimensional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to a substrate in the cross-sectional views, and "horizontal" refers to a direction parallel to a substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

In accordance with an embodiment of the present invention, cut fill materials are utilized for SADP that match a spacer material, thus reducing, by at least one, a number of mutually selective materials needed for processing, when compared with conventional approaches. Embodiments of the present invention can be applied in different stages of patterning, such as, for example, back end of line (BEOL), front end of line (FEOL), and middle of line (MOL) applications.

As used herein, a "line" in a patterned design refers to a design intended to make a horizontal connection. By way of non-limiting example, in the BEOL, this may be a pattern for a conductor at a given interconnect level. In the FEOL, this may be a pattern for fins (in FinFET devices) or gates.

Figure 1A:
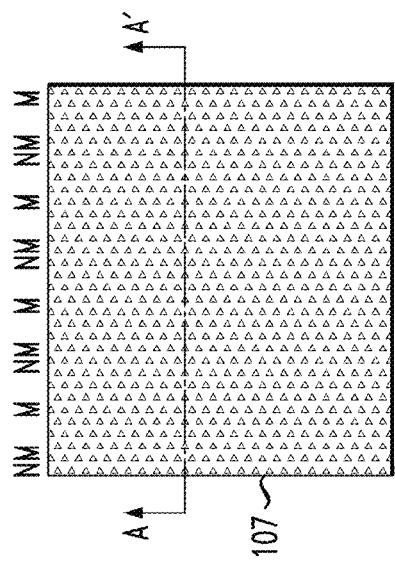

FIG. 1A is a top view and FIG. 1B is a cross-sectional view taken along line A-A' of FIG. 1A illustrating fabrication of a semiconductor device and showing a mandrel material layer formed on dielectric and mask layers, according to an exemplary embodiment of the present invention. Referring to FIGS. 1A and 1B, a hardmask 105, such as, for example, titanium nitride (TiN), or other suitable material, is formed on a dielectric layer 103, such as, for example, silicon dioxide ($SiO_2$), carbon-doped silicon oxide (SiCOH), SiLK® dielectrics, porous forms of these dielectric films, or other low-k dielectric films.

According to an embodiment, the dielectric layer 103 is an inter-layer dielectric layer that is to be part of a BEOL interconnect structure of an integrated circuit where devices, including, but not limited to, transistors, capacitors, and resistors are interconnected with metallization layers (e.g., wiring) on a wafer. As can be understood by one of ordinary skill in the art, the dielectric layer 103 can be on a semiconductor substrate (not shown), with intervening layers between the dielectric layer 103 and the substrate. A semiconductor substrate can be, for example, a bulk substrate or a silicon-on-insulator (SOI) substrate including a buried insulating layer, such as, for example, a buried oxide or nitride layer located on an upper surface of the semiconductor substrate. The substrate may comprise semiconductor material including, but not limited to, Si, SiGe, SiC, SiGeC or other like semiconductor. In addition, multiple layers of the semiconductor materials can be used as the semiconductor material of the substrate. A plurality of devices can be on the substrate, such as, for example, transistors, capacitors, and resistors. In addition, intervening layers can be formed between the dielectric layer 103 and the hardmask 105 depending on the specific application.

Although discussed in the context of BEOL, the embodiments of the present invention are not necessarily limited thereto, and may include other applications, such as, for example, MOL, FEOL or other interconnects.

A mandrel material layer 107 is deposited on the hardmask 105. The mandrel material can include, for example, an organic (carbon-based) material, such as, for example, amorphous carbon, and/or polymers, and is deposited using, for example, any suitable deposition technique known in the art, including, but not limited to, chemical vapor deposition (CVD), plasma enhanced CVD (PECVD), physical vapor deposition (PVD), atomic layer deposition (ALD), molecular beam deposition (MBD), pulsed laser deposition (PLD), and/or liquid source misted chemical deposition (LSMCD).

Figure 1C:
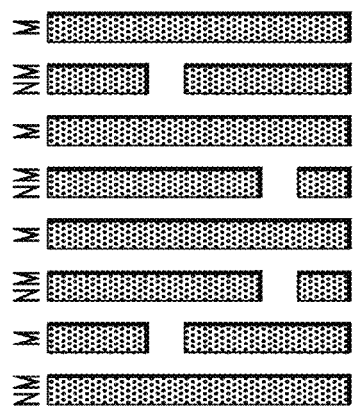
FIG. 1C is a top schematic view showing a designed pattern including mandrel and non-mandrel portions, according to an exemplary embodiment of the present invention.

FIG. 1C is a top schematic view showing a designed circuit pattern including mandrel and non-mandrel portions, according to an exemplary embodiment of the present invention. The mandrel portions (M) correspond to lines defined by the width of mandrels, and the non-mandrel portions correspond to lines that are not defined by mandrels.

Figure 2B:
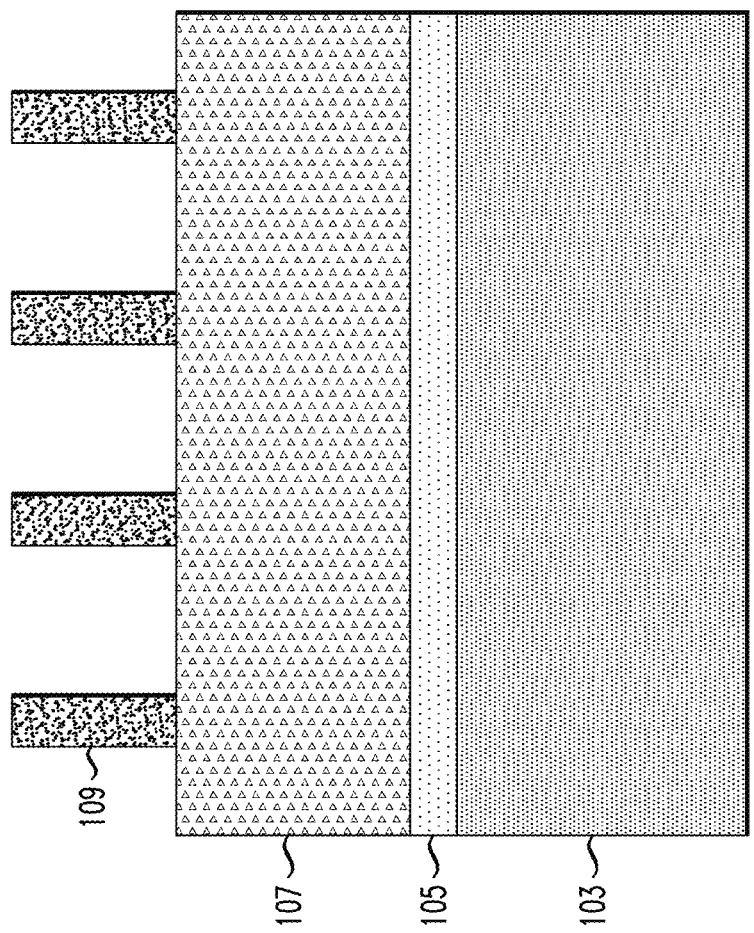
FIG. 2A is a top view and FIG. 2B is a cross-sectional view taken along line B-B' of FIG. 2A illustrating fabrication of a semiconductor device and showing photoresists formed on the mandrel material layer, according to an exemplary embodiment of the present invention.
Figure 2A:
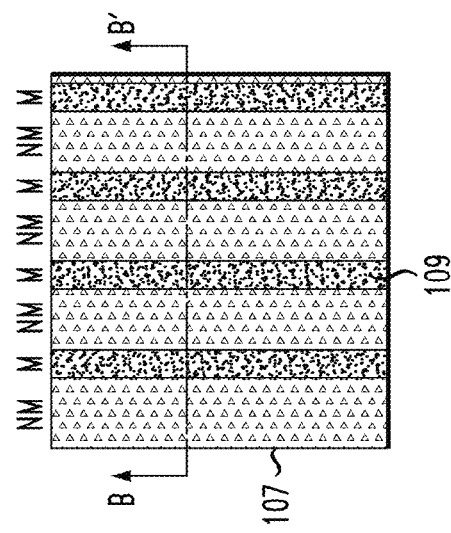

FIG. 2A is a top view and FIG. 2B is a cross-sectional view taken along line B-B' of FIG. 2A illustrating fabrication of a semiconductor device and showing photoresists formed on the mandrel material layer, according to an exemplary embodiment of the present invention. Referring to FIGS. 2A and 2B, photoresists 109 are formed on the mandrel material layer 107. The photoresists 109 are spaced apart in a pattern that will define where mandrels are formed in a subsequent removal process. Using optical lithography, the photoresists 109 are lithographically patterned, and exposed and transferred onto the mandrel material layer 107. The photoresists 109 are used as mask when etching the mandrel material layer 107.

FIG. 3A is a top view and FIG. 3B is a cross-sectional view taken along line C-C' of FIG. 3A illustrating fabrication of a semiconductor device and showing patterning of mandrels and removal of the photoresists, according to an exemplary embodiment of the present invention. Referring to FIGS. 3A and 3B, exposed portions of the mandrel material layer 107 not covered by the photoresists 109 are removed using, for example, an etching process, such as reactive ion etching (RIE), to result in mandrels 117 corresponding to the photoresists 109. After etching, the photoresists 109 can be removed selective to the patterned mandrels 117, for example, by ashing.

Figure 4B:
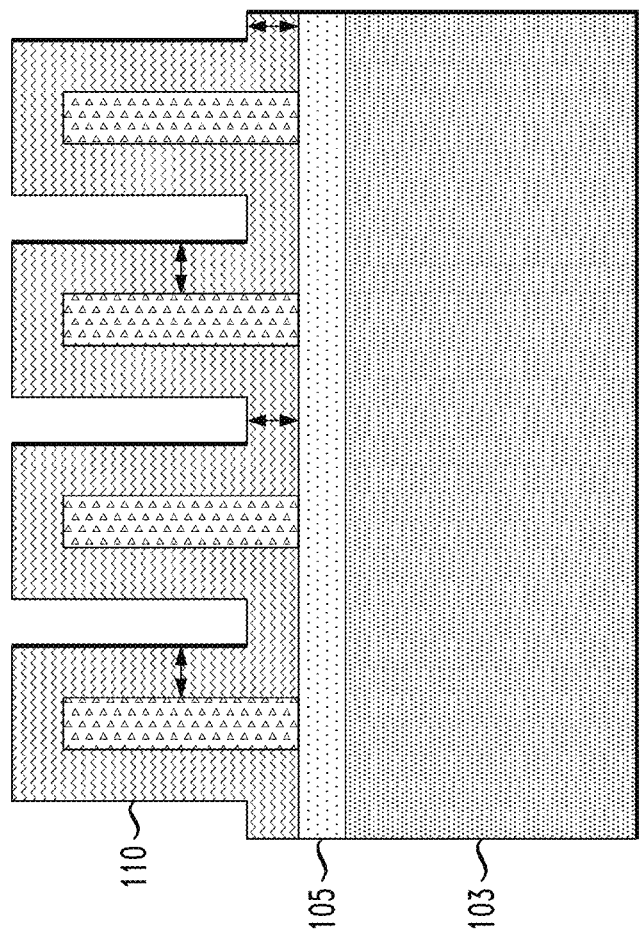
FIG. 4A is a top view and FIG. 4B is a cross-sectional view taken along line D-D' of FIG. 4A illustrating fabrication of a semiconductor device and showing spacer deposition, according to an exemplary embodiment of the present invention.
Figure 4A:
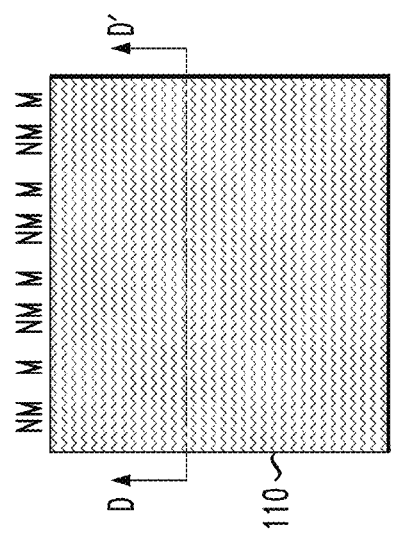

FIG. 4A is a top view and FIG. 4B is a cross-sectional view taken along line D-D' of FIG. 4A illustrating fabrication of a semiconductor device and showing spacer deposition, according to an exemplary embodiment of the present invention. Referring to FIGS. 4A and 4B, a spacer layer 110, comprising for example, an oxide, such as, silicon dioxide ($SiO_2$), or another material such as, for example, silicon nitride (SiN), siliconborocarbonitride (SiBCN) or titanium dioxide ($TiO_2$), is conformally deposited on the mandrels 117 and the hardmask layer 105. The conformal deposition can be performed using, for example, ALD or CVD. A thickness of the spacer layer 110 (e.g., width or height), as shown by the arrows in FIG. 4B, can be less than or equal to about 20 nm. As explained further herein, a width of a resulting line in the patterned design is defined by the width of the spacer layer 110.

Figure 5B:
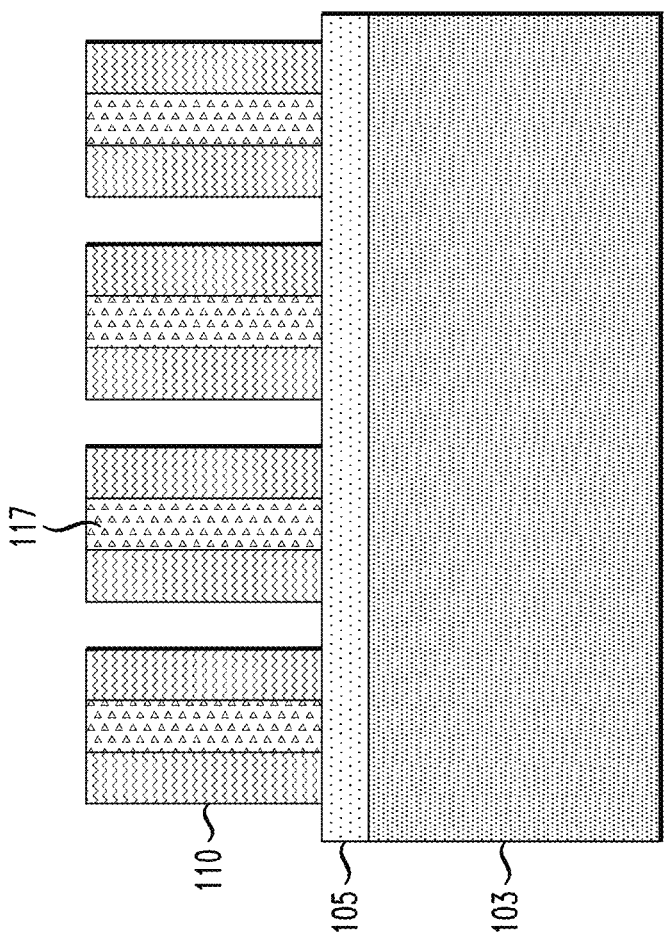
FIG. 5A is a top view and FIG. 5B is a cross-sectional view taken along line E-E' of FIG. 5A illustrating fabrication of a semiconductor device and showing removal of portions of spacer material, according to an exemplary embodiment of the present invention.
Figure 5A:
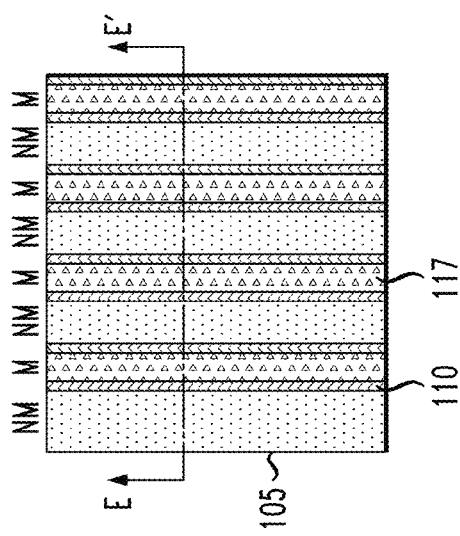

FIG. 5A is a top view and FIG. 5B is a cross-sectional view taken along line E-E' of FIG. 5A illustrating fabrication of a semiconductor device and showing removal of portions of spacer material, according to an exemplary embodiment of the present invention. Referring to FIGS. 5A and 5B, a directional top-down etching process is performed to remove horizontal portions of the spacer layer 110 from the surface of the hardmask 105 and from a top surface of the mandrels 117. The directional etching can be performed by, for example, an anisotropic etching process, such as, for example RIE.

Figure 6B:
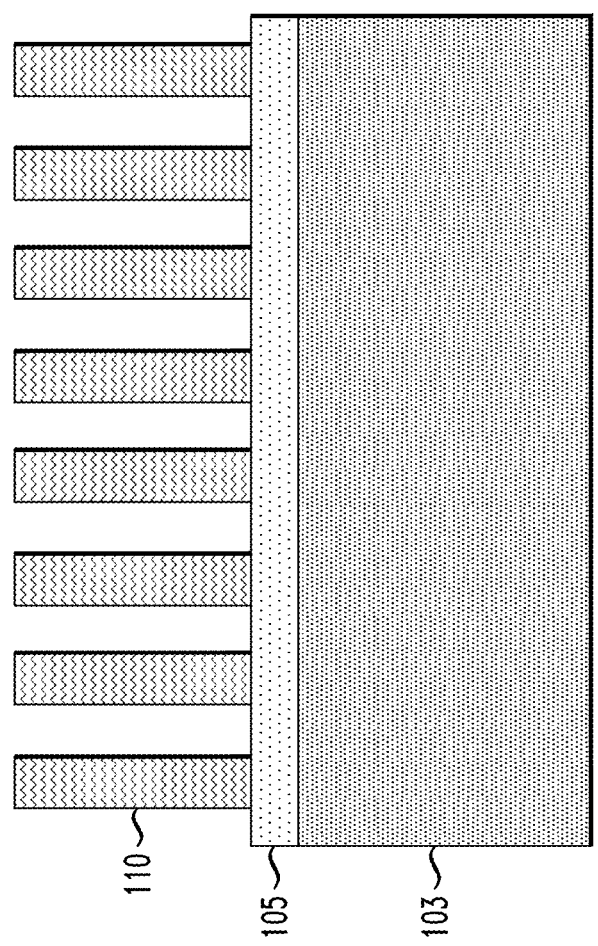
FIG. 6A is a top view and FIG. 6B is a cross-sectional view taken along line F-F' of FIG. 6A illustrating fabrication of a semiconductor device and showing removal of mandrels, according to an exemplary embodiment of the present invention.
Figure 6A:
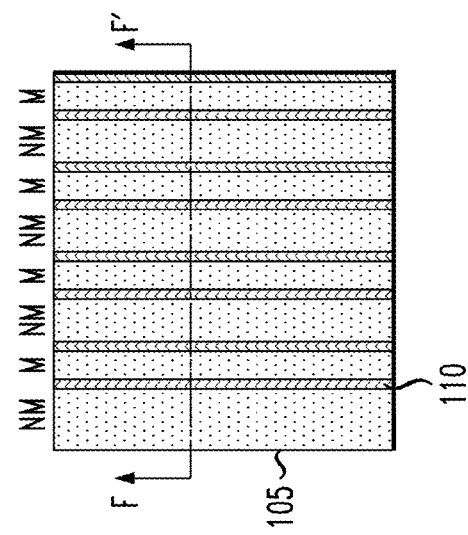

FIG. 6A is a top view and FIG. 6B is a cross-sectional view taken along line F-F' of FIG. 6A illustrating fabrication of a semiconductor device and showing removal of mandrels, according to an exemplary embodiment of the present invention. Referring to FIGS. 6A and 6B, the mandrels 117 are removed by etching the mandrels 117 selective to the material of the spacers 110 and the hardmask material 105. According to an embodiment, the mandrels 117 are removed from between the spacers 110 as shown to expose portions of the hardmask layer 105 that were under the mandrels 117. The mandrels 117 are removed using, for example, an ashing process containing oxygen plasma to strip amorphous carbon or poly mandrel materials.

Figure 7B:
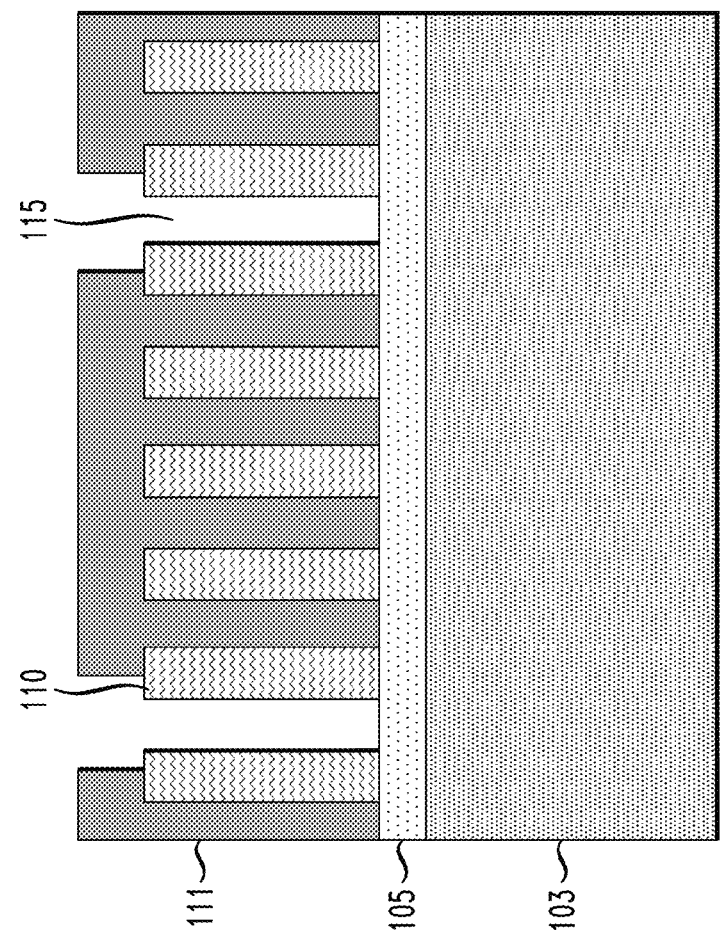
FIG. 7A is a top view and FIG. 7B is a cross-sectional view taken along line G-G' of FIG. 7A illustrating fabrication of a semiconductor device and showing formation and patterning of a fill material layer, according to an exemplary embodiment of the present invention.
Figure 7A:
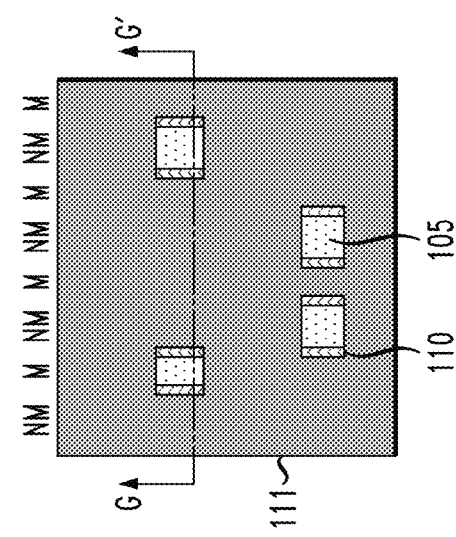

FIG. 7A is a top view and FIG. 7B is a cross-sectional view taken along line G-G' of FIG. 7A illustrating fabrication of a semiconductor device and showing formation and patterning of a fill material layer, according to an exemplary embodiment of the present invention. Referring to FIGS. 7A and 7B, a fill material layer 111 is deposited and patterned. According to an embodiment of the present invention, the fill material layer 111 is an organic layer, such as, but not necessarily limited to, an organic planarization layer (OPL), which can be deposited using a spin-on process. The fill material layer 111 can be patterned using for example, lithography and etching, to include openings or cuts 115 exposing the hardmask 105.

Figure 8B:
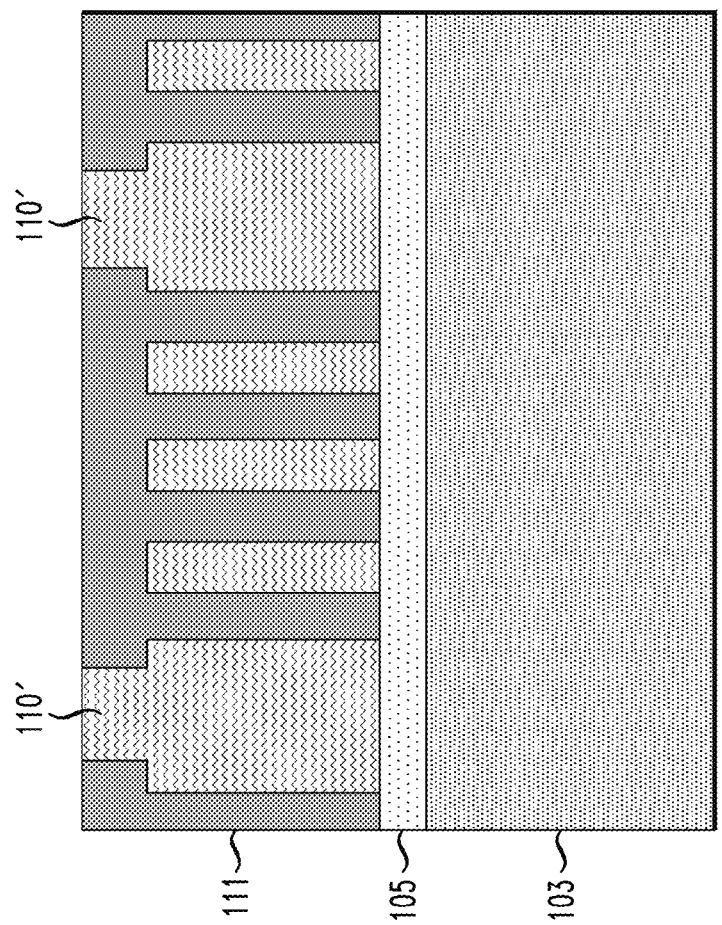
FIG. 8A is a top view and FIG. 8B is a cross-sectional view taken along line H-H' of FIG. 8A illustrating fabrication of a semiconductor device and showing formation of a cut fill material layer, according to an exemplary embodiment of the present invention.
Figure 8A:
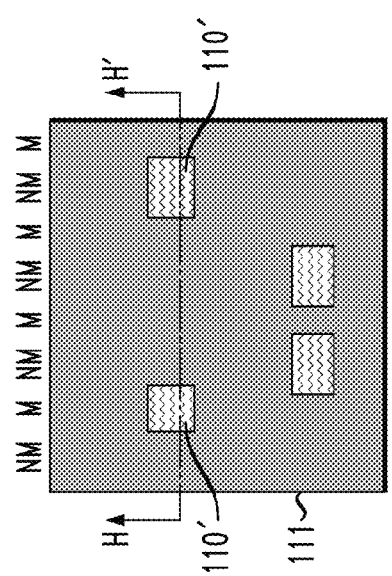

FIG. 8A is a top view and FIG. 8B is a cross-sectional view taken along line H-H' of FIG. 8A illustrating fabrication of a semiconductor device and showing formation of a cut fill material layer, according to an exemplary embodiment of the present invention. Referring to FIGS. 8A and 8B, a cut fill material layer 110' is deposited in the openings or cuts 115 in the fill material layer 111. Alternatively, the cut fill material 110' may be deposited conformally everywhere and etched back using, for example, a RIE process, to fill only the openings or cuts 115. The cut fill material layer 110' comprises the same material as that of the spacer layer 110, or at least a material in the same class as the material of the spacer layer 110 so that other materials can be selectively etched with respect to both the cut fill material layer 110' and the spacer layer 110, and/or both the cut fill material layer 110' and the spacer layer 110 can be simultaneously selectively etched with respect to other layers. Accordingly, like the spacer layer 110, the cut fill material layer 110' includes, for example, an oxide, such as, silicon dioxide ($SiO_2$), or another material such as, for example, silicon nitride (SiN), siliconborocarbonitride (SiBCN) or titanium dioxide ($TiO_2$). The conformal deposition can be performed using, for example, ALD or CVD.

Figure 9B:
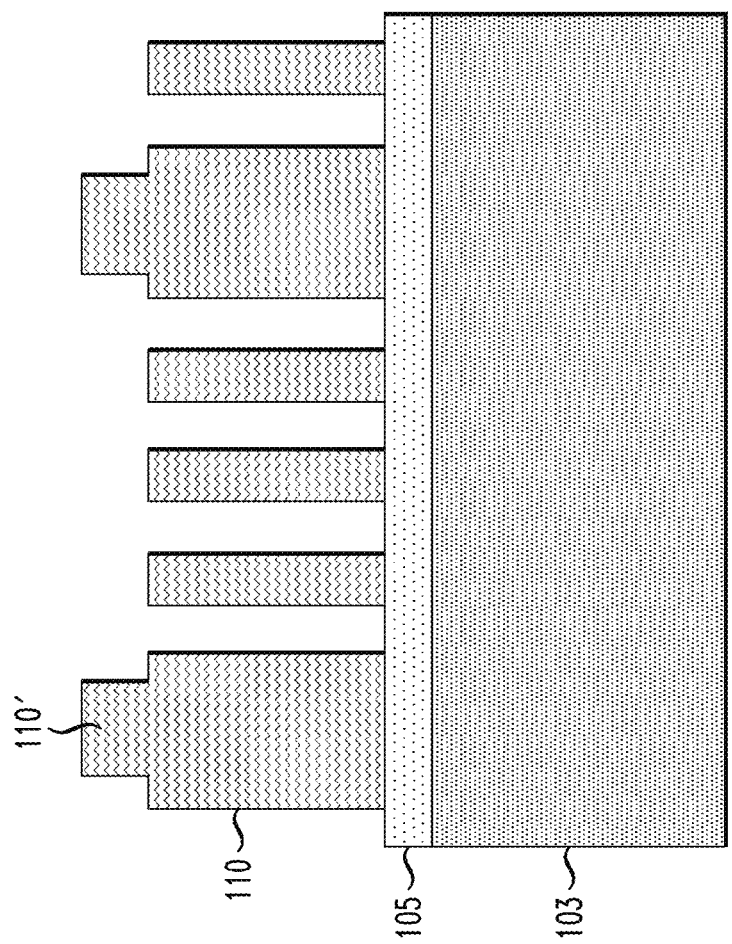
FIG. 9A is a top view and FIG. 9B is a cross-sectional view taken along line I-I' of FIG. 9A illustrating fabrication of a semiconductor device and showing removal of the fill material layer, according to an exemplary embodiment of the present invention.
Figure 9A:
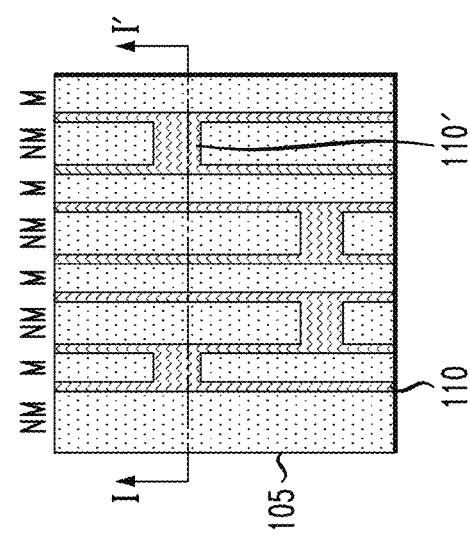

FIG. 9A is a top view and FIG. 9B is a cross-sectional view taken along line I-I' of FIG. 9A illustrating fabrication of a semiconductor device and showing removal of the fill material layer, according to an exemplary embodiment of the present invention. Referring to FIGS. 9A and 9B, the fill material layer 111 is stripped using, for example, oxygen plasma, nitrogen plasma, hydrogen plasma or other carbon strip process. The stripping causes minimal or no damage to the spacer or cut fill material layers 110, 110', or the hardmask layer 105. As can be understood, in accordance with an embodiment of the present invention, the spacer and cut fill material layers 110, 110' include the same material, or at least a material in the same class as each other so that the fill material layer 111 need only be selectively removed with respect to two materials, the material of the hardmask 105, and the material of the spacer and the cut fill material layers 110, 110'.

FIG. 10A is a top view and FIG. 10B is a cross-sectional view taken along line J-J' of FIG. 10A illustrating fabrication of a semiconductor device and showing removal of portions of the mask layer, according to an exemplary embodiment of the present invention. Referring to FIGS. 10A and 10B, the exposed portions of the hardmask layer 105, for example, TiN, not under the spacer and cut fill material layers 110, 110', are selectively etched with respect to the spacer and cut fill material layers 110, 110', using, for example, RIE. As can be understood, in accordance with an embodiment of the present invention, the spacer and cut fill material layers 110, 110' include the same material, or at least a material in the same class as each other so that the exposed portions of the hardmask layer 105 need only be selectively removed with respect to two materials, the material of the dielectric 103, and the material of the spacer and cut fill material layers 110, 110'.

FIG. 10C is a top schematic view showing a designed pattern including mandrel and non-mandrel portions, according to an exemplary embodiment of the present invention. Referring to FIGS. 10A and 10C, the resulting pattern of lines in FIG. 10A, including non-mandrel (NM) and mandrel (M) portions, corresponds to the pattern of lines in FIG. 10C.

Figure 11B:
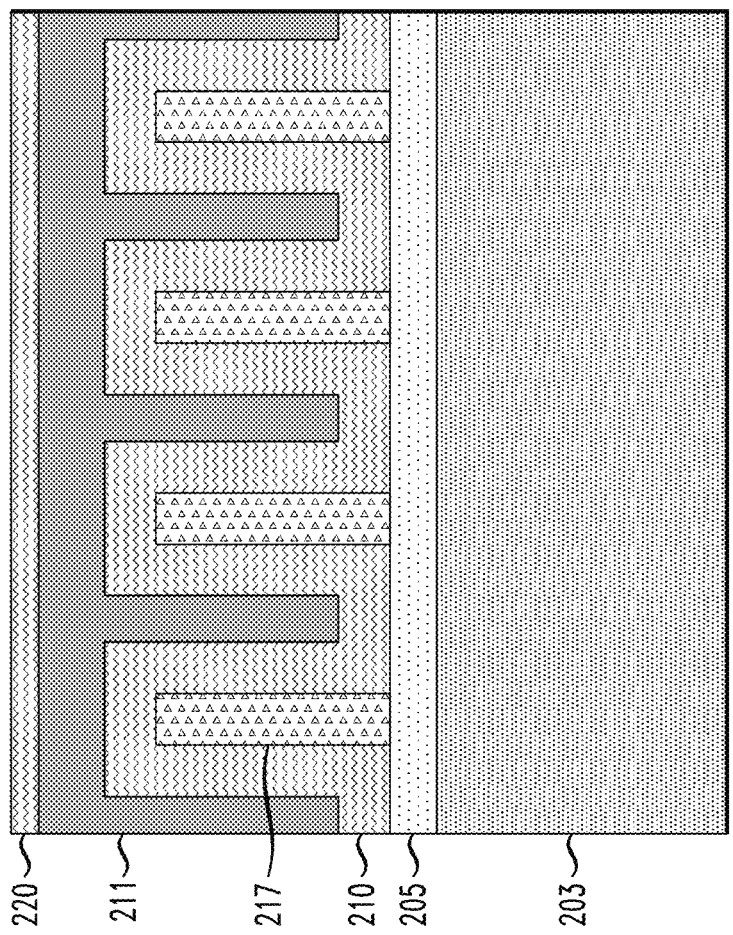
FIG. 11A is a top view and FIG. 11B is a cross-sectional view taken along line K-K' of FIG. 11A illustrating fabrication of a semiconductor device and showing formation of a blockout fill material layer and an upper dielectric layer on the blockout fill material layer, according to an exemplary embodiment of the present invention.
Figure 11A:
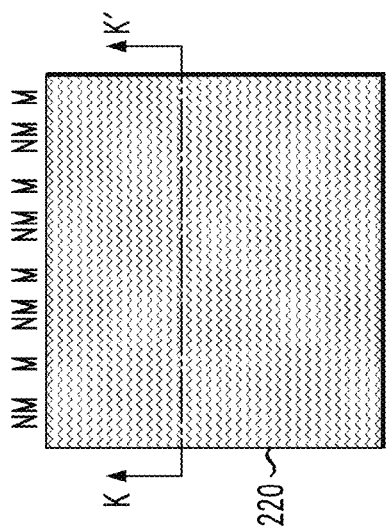

FIG. 11A is a top view and FIG. 11B is a cross-sectional view taken along line K-K' of FIG. 11A illustrating fabrication of a semiconductor device and showing formation of a blockout fill material layer and an upper dielectric layer on the blockout fill material layer, according to an exemplary embodiment of the present invention. FIGS. 11A and 11B follow after the same or similar processing described in connection with FIGS. 1A-4B. The same or similar elements from FIGS. 1A-4B are designated by similar reference numerals in FIGS. 11A and 11B. For example, the dielectric layer, hardmask layer, spacer layer and mandrels are designated as 203, 205, 210 and 217, respectively.

Referring to FIGS. 11A and 11B, a blockout fill material layer 211 is deposited on the spacer layer 210 and an upper dielectric layer 220 is deposited on the blockout fill material layer 211. According to an embodiment of the present invention, the blockout fill material layer 211 is an organic layer, such as, but not necessarily limited to, an organic planarization layer (OPL), which can be deposited using a spin-on process. The upper dielectric layer 220 includes, for example, an oxide, such as, silicon dioxide ($SiO_2$), or another material such as, for example, silicon nitride (SiN), siliconborocarbonitride (SiBCN) or titanium dioxide ($TiO_2$), and is deposited on the blockout fill material layer 211 using any suitable deposition technique known in the art, including, but not limited to, CVD, PECVD, PVD, ALD, MBD, PLD, and/or LSMCD. The upper dielectric layer 220 facilitates lithographic patterning, and may be omitted. According to an embodiment, the upper dielectric layer 220 includes the same material as that of the spacer layer 210, or at least a material in the same class as the material of the spacer layer 210.

Figure 12B:
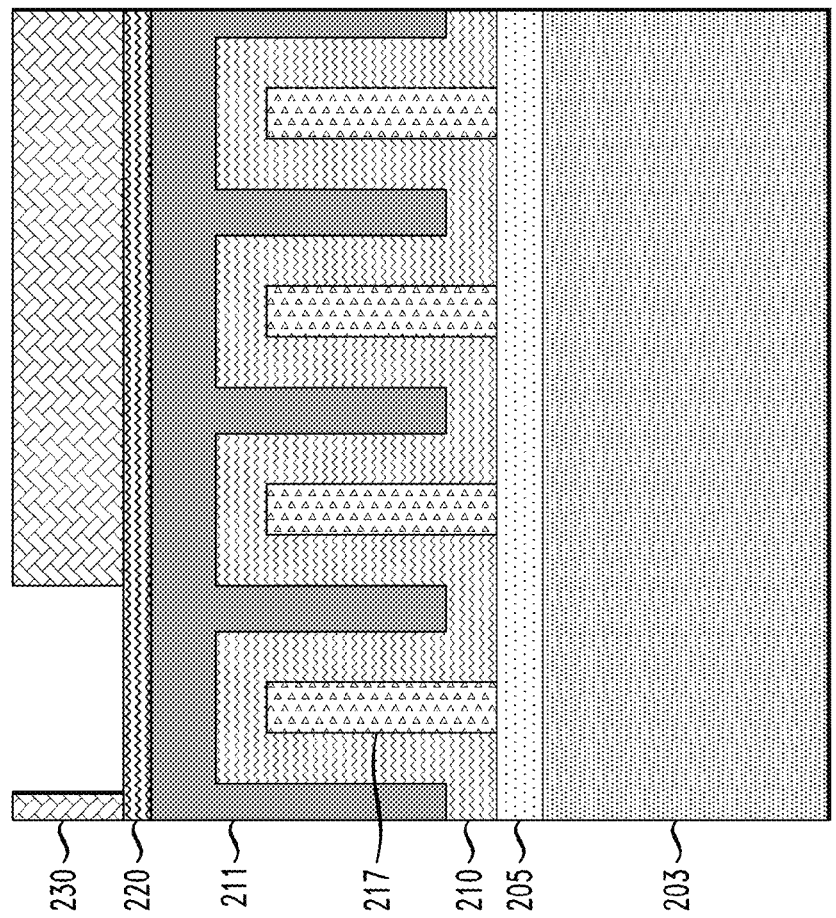
FIG. 12A is a top view and FIG. 12B is a cross-sectional view taken along line L-L' of FIG. 12A illustrating fabrication of a semiconductor device and showing formation of a photoresist layer, according to an exemplary embodiment of the present invention.
Figure 12A:
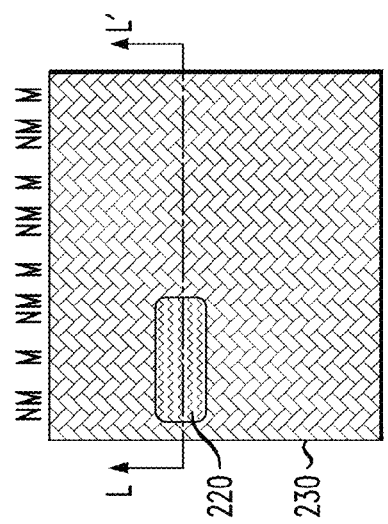

FIG. 12A is a top view and FIG. 12B is a cross-sectional view taken along line L-L' of FIG. 12A illustrating fabrication of a semiconductor device and showing formation of a photoresist layer, according to an exemplary embodiment of the present invention. Referring to FIGS. 12A and 12B, a patterned photoresist layer 230 is formed on the upper dielectric layer 220. The photoresist layer 230 is patterned to define where one or more openings are to be formed in a subsequent removal process. Using optical lithography, the photoresist layer 230 is lithographically patterned, and exposed and transferred onto the upper dielectric layer 220. The photoresist layer 230 is used as mask when etching the upper dielectric layer 220 and the blockout fill material layer 211.

Figure 13B:
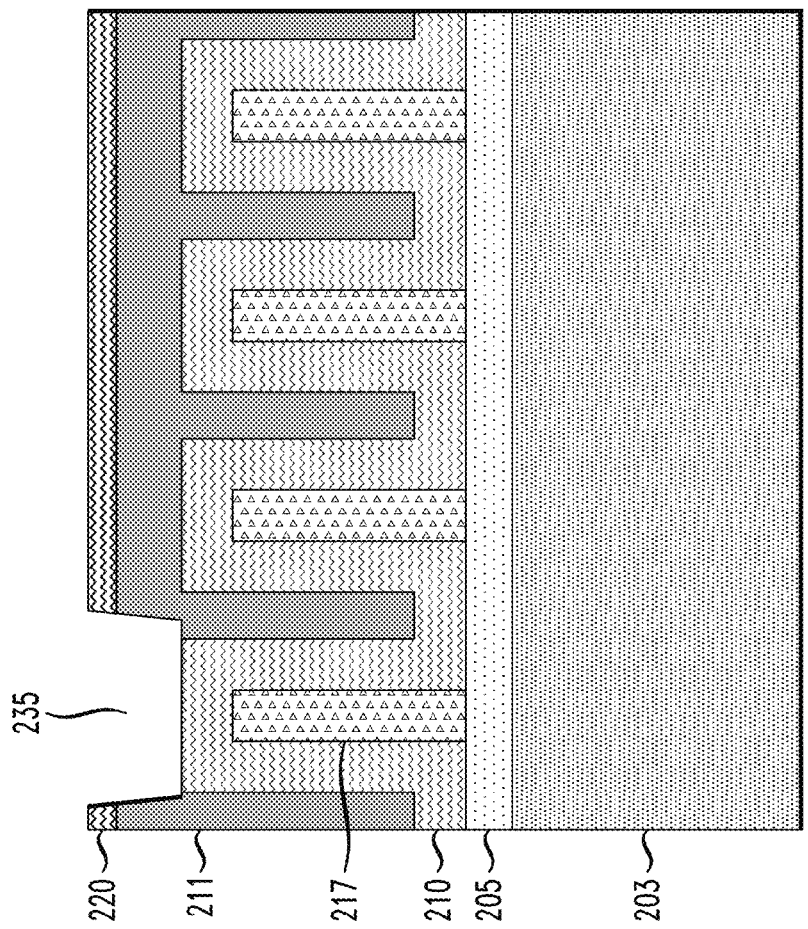
FIG. 13A is a top view and FIG. 13B is a cross-sectional view taken along line M-M' of FIG. 13A illustrating fabrication of a semiconductor device and showing removal of a portion of the blockout fill material and upper dielectric layers, according to an exemplary embodiment of the present invention.
Figure 13A:
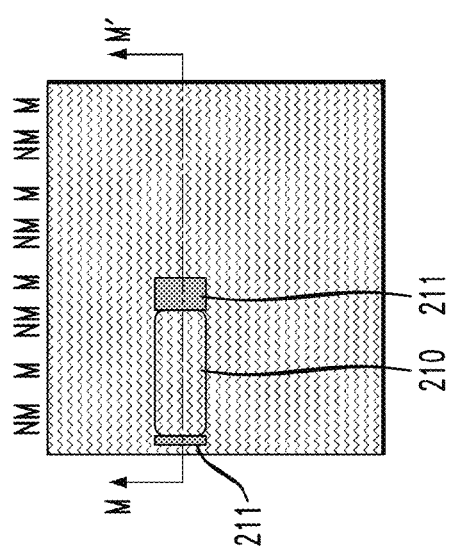

FIG. 13A is a top view and FIG. 13B is a cross-sectional view taken along line M-M' of FIG. 13A illustrating fabrication of a semiconductor device and showing removal of a portion of the blockout fill material and upper dielectric layers, according to an exemplary embodiment of the present invention. Referring to FIGS. 13A and 13B, portions of the blockout fill material layer 211 and the upper dielectric layer 220 are removed corresponding to the opening in the photoresist layer 230 using for example, lithography and etching, to form opening or cut 235 exposing a portion of the spacer layer 210 on a mandrel 217. After etching, the photoresist layer 230 can be removed selective to the upper dielectric layer 220, blockout fill material 211 and spacer layer 210, for example, by ashing.

Figure 14B:
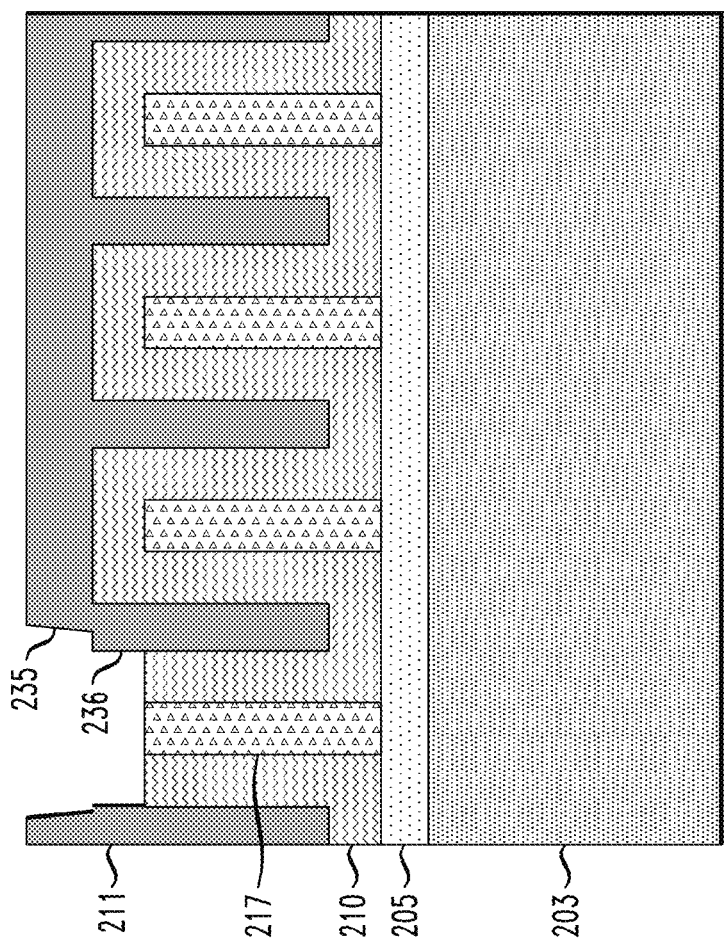
FIG. 14A is a top view and FIG. 14B is a cross-sectional view taken along line N-N' of FIG. 14A illustrating fabrication of a semiconductor device and showing removal of the upper dielectric layer and a portion of the spacer layer, according to an exemplary embodiment of the present invention.
Figure 14A:
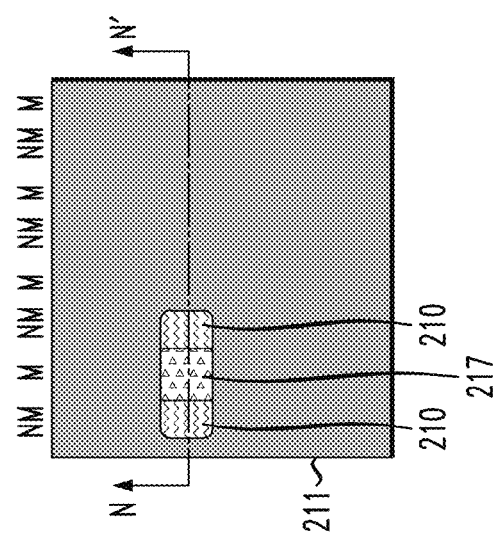

FIG. 14A is a top view and FIG. 14B is a cross-sectional view taken along line N-N' of FIG. 14A illustrating fabrication of a semiconductor device and showing removal of the upper dielectric layer and a portion of the spacer layer, according to an exemplary embodiment of the present invention. Referring to FIGS. 14A and 14B, the upper dielectric layer 220 and a portion of the spacer layer 210 are removed to form additional opening 236 under opening 235. According to an embodiment of the present invention, a directional top-down etching process is performed to selectively remove the upper dielectric layer 220 and a horizontal portion of the spacer layer 210 from a top surface of a mandrels 217. The directional etching can be performed by, for example, an anisotropic etching process, such as, for example ME. The etching is selective with respect to the blockout fill material 211. According to an embodiment, the upper dielectric layer 220 and the spacer layer 210 include the same material, or at least materials in the same class as each other so that both the upper dielectric layer 220 and the spacer layer 210 can be simultaneously selectively etched with respect to other layers.

Figure 15B:
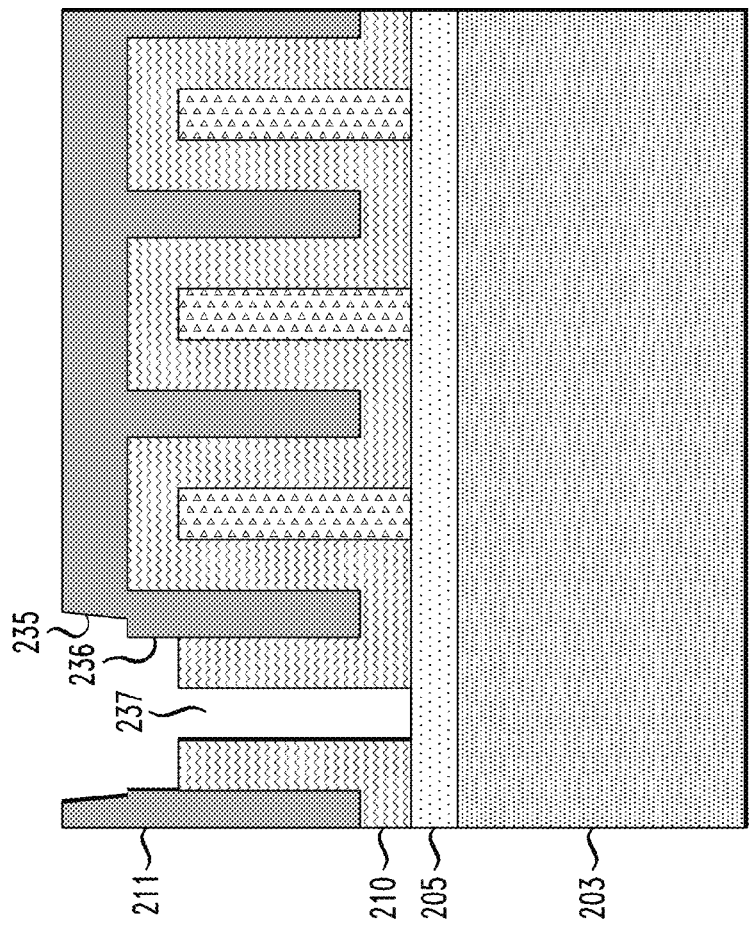
FIG. 15A is a top view and FIG. 15B is a cross-sectional view taken along line O-O' of FIG. 15A illustrating fabrication of a semiconductor device and showing removal of a mandrel, according to an exemplary embodiment of the present invention, according to an exemplary embodiment of the present invention.
Figure 15A:
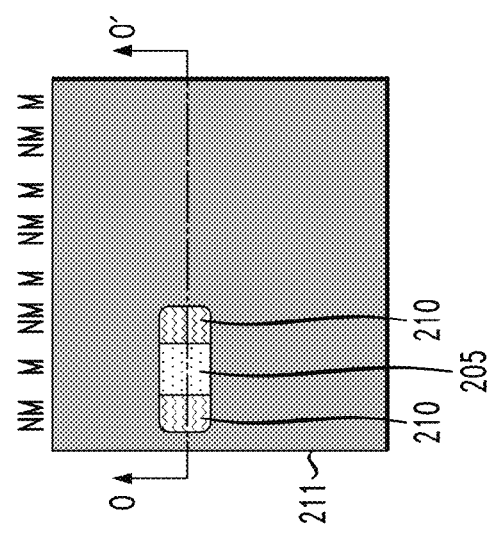

FIG. 15A is a top view and FIG. 15B is a cross-sectional view taken along line O-O' of FIG. 15A illustrating fabrication of a semiconductor device and showing removal of a mandrel, according to an exemplary embodiment of the present invention. Referring to FIGS. 15A and 15B, a mandrel 217 is removed by etching the mandrel 217 selective to the blockout fill material 211, the spacer layer 210 and the hardmask 205. According to an embodiment, the mandrel 217 is removed from between two spacers 210 as shown to form an opening or cut 237 exposing a portion of the hardmask layer 205 that was under the mandrel 217. The mandrel 217 is removed using, for example, an ashing process containing oxygen plasma to strip amorphous carbon or poly mandrel materials.

Figure 16B:
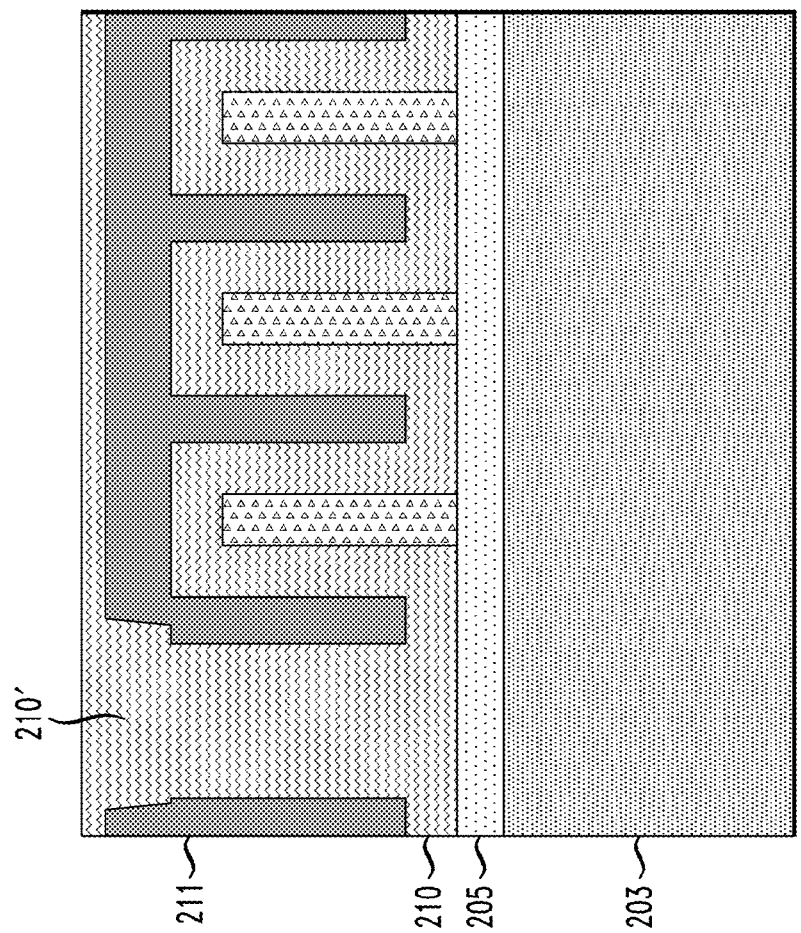
FIG. 16A is a top view and FIG. 16B is a cross-sectional view taken along line P-P' of FIG. 16A illustrating fabrication of a semiconductor device and showing formation of a first cut fill material layer, according to an exemplary embodiment of the present invention.
Figure 16A:
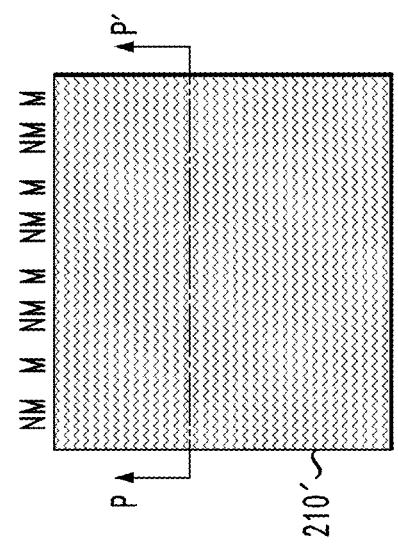

FIG. 16A is a top view and FIG. 16B is a cross-sectional view taken along line P-P' of FIG. 16A illustrating fabrication of a semiconductor device and showing formation of a first cut fill material layer, according to an exemplary embodiment of the present invention. Referring to FIGS. 16A and 16B, a first cut fill material layer 210' is conformally deposited in the openings or cuts 235, 236 and 237. The first cut fill material layer 210' comprises the same material as that of the spacer layer 210, or at least a material in the same class as the material of the spacer layer 210 so that other materials can be selectively etched with respect to both the first cut fill material layer 210' and the spacer layer 210, and/or both the first cut fill material layer 210' and the spacer layer 210 can be simultaneously selectively etched with respect to other layers. Accordingly, like the spacer layer 210, the first cut fill material layer 210' includes, for example, an oxide, such as, silicon dioxide ($SiO_2$), or another material such as, for example, silicon nitride (SiN), siliconborocarbonitride (SiBCN) or titanium dioxide ($TiO_2$). The conformal deposition can be performed using, for example, ALD or CVD.

Figure 17B:
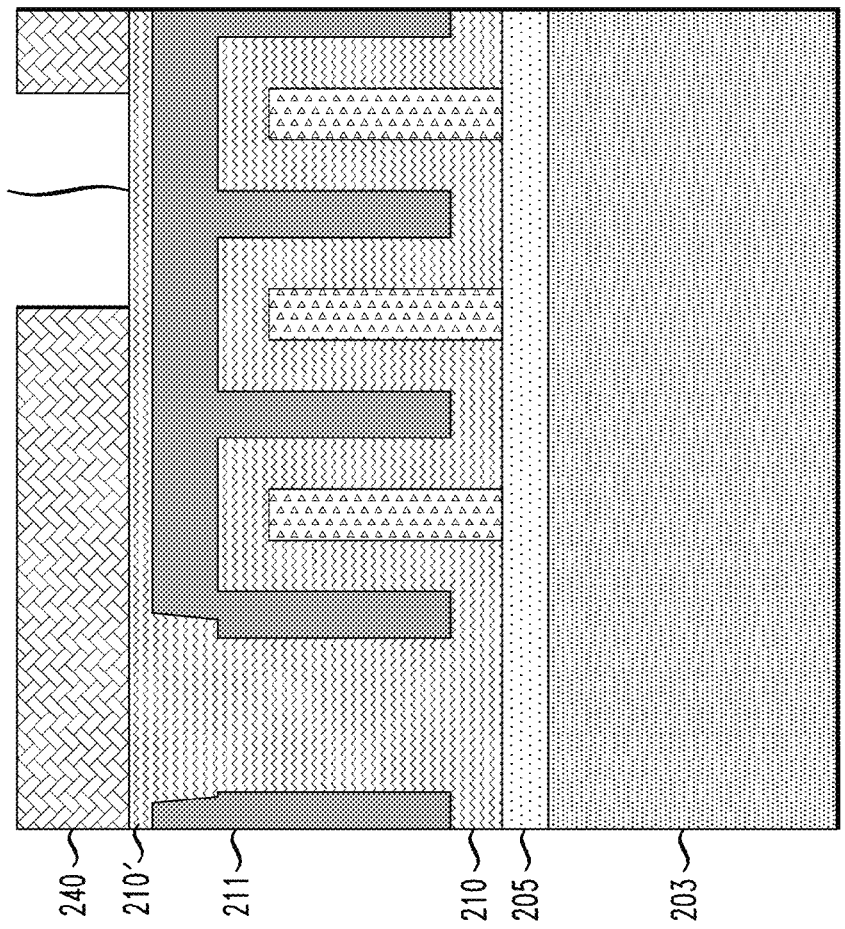
FIG. 17A is a top view and FIG. 17B is a cross-sectional view taken along line Q-Q' of FIG. 17A illustrating fabrication of a semiconductor device and showing formation of a photoresist layer, according to an exemplary embodiment of the present invention.
Figure 17A:
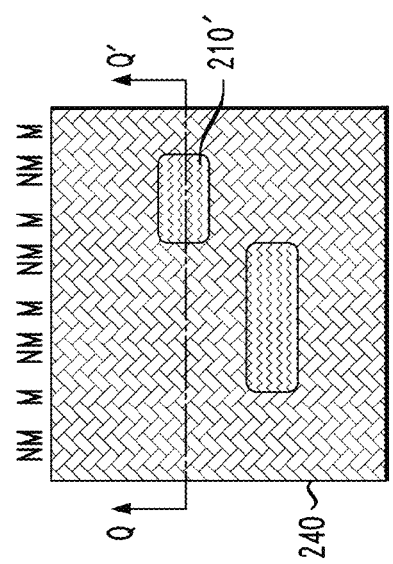

FIG. 17A is a top view and FIG. 17B is a cross-sectional view taken along line Q-Q' of FIG. 17A illustrating fabrication of a semiconductor device and showing formation of a photoresist layer, according to an exemplary embodiment of the present invention. Referring to FIGS. 17A and 17B, a patterned photoresist layer 240 is formed on the first cut fill material layer 210'. The photoresist layer 240 is patterned to define where one or more openings are to be formed in a subsequent removal process. Using optical lithography, the photoresist layer 240 is lithographically patterned, and exposed and transferred onto the first cut fill material layer 210'. The photoresist layer 240 is used as mask when etching the first cut fill material layer 210' and the blockout fill material layer 211.

Figure 18B:
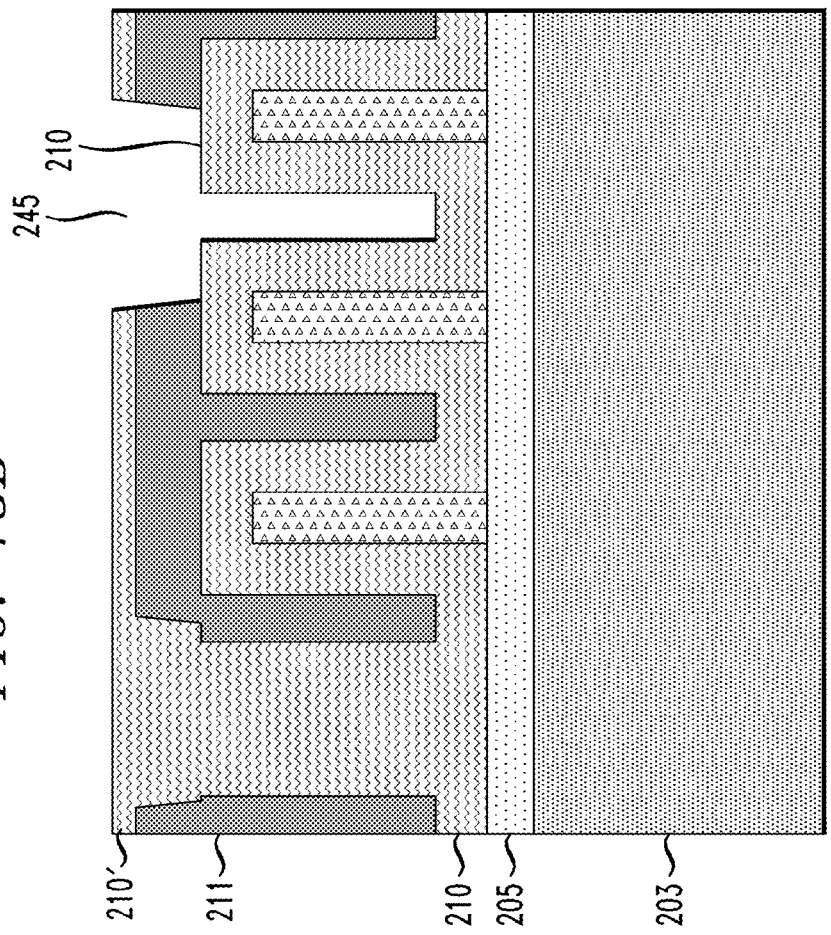
FIG. 18A is a top view and FIG. 18B is a cross-sectional view taken along line R-R' of FIG. 18A illustrating fabrication of a semiconductor device and showing removal of a portion of the blockout fill material and first cut fill material layer, according to an exemplary embodiment of the present invention.
Figure 18A:
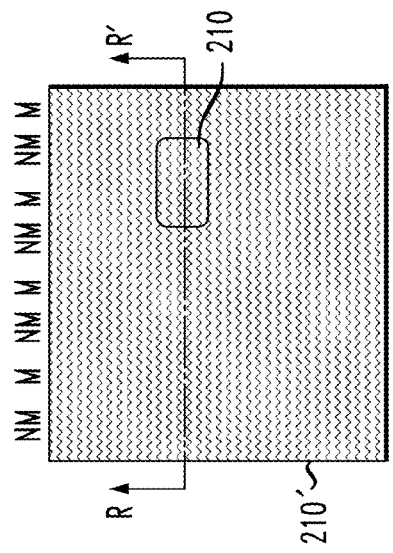

FIG. 18A is a top view and FIG. 18B is a cross-sectional view taken along line R-R' of FIG. 18A illustrating fabrication of a semiconductor device and showing removal of a portion of the blockout fill material and a portion of the first cut fill material layer, according to an exemplary embodiment of the present invention. Referring to FIGS. 18A and 18B, portions of the blockout fill material layer 211 and the first cut fill material layer 210' are removed corresponding to the opening in the photoresist layer 240 using for example, lithography and etching, to form opening or cut 245 exposing a portion of the spacer layer 210 between two mandrels 217. After etching, the photoresist layer 240 can be removed selective to the first cut fill material layer 210', blockout fill material 211 and spacer layer 210, for example, by ashing.

Figure 19B:
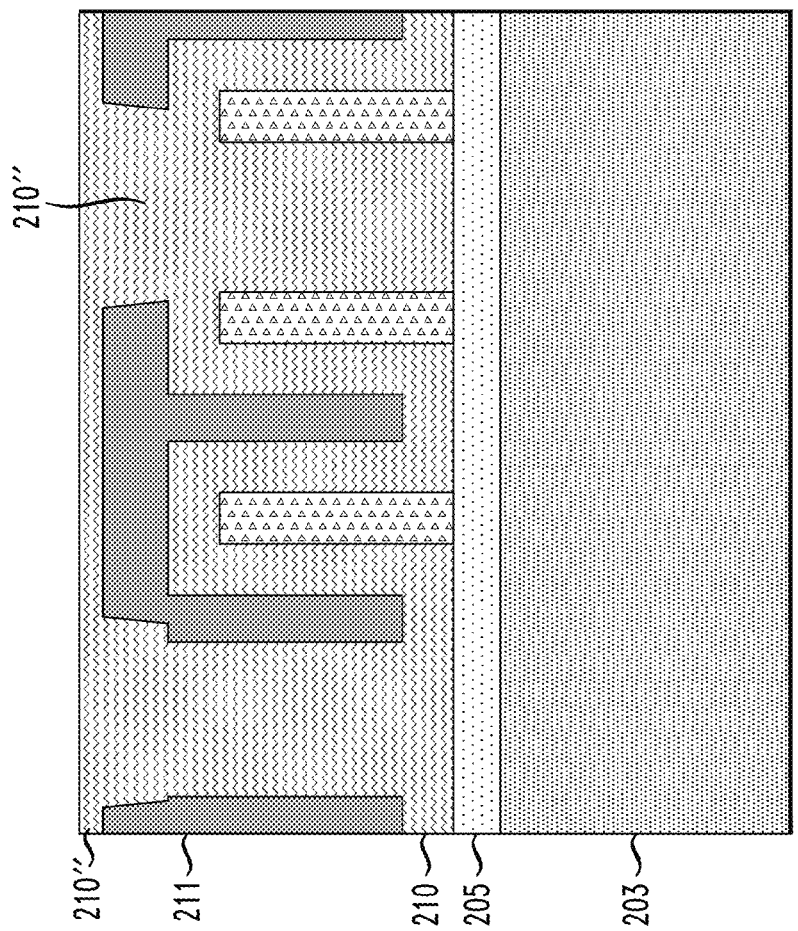
FIG. 19A is a top view and FIG. 19B is a cross-sectional view taken along line S-S' of FIG. 19A illustrating fabrication of a semiconductor device and showing formation of a second cut fill material layer, according to an exemplary embodiment of the present invention.
Figure 19A:
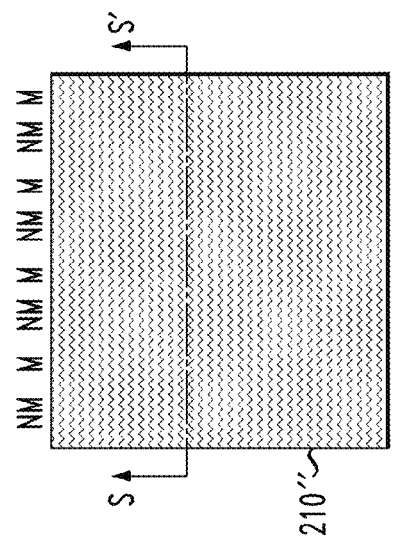

FIG. 19A is a top view and FIG. 19B is a cross-sectional view taken along line S-S' of FIG. 19A illustrating fabrication of a semiconductor device and showing formation of a second cut fill material layer, according to an exemplary embodiment of the present invention. Referring to FIGS. 19A and 19B, a second cut fill material layer 210" is conformally deposited in the opening or cut 245. The second cut fill material layer 210" comprises the same material as that of the spacer layer 210 (and first cut material layer 210'), or at least a material in the same class as the material of the spacer layer 210 (and first cut material layer 210') so that other materials can be selectively etched with respect to the first and second cut fill material layers 210', 210" and the spacer layer 210, and/or the first and second cut fill material layers 210', 210" and the spacer layer 210 can be simultaneously selectively etched with respect to other layers. Accordingly, like the spacer layer 210 and first cut material layer 210', the second cut fill material layer 210" includes, for example, an oxide, such as, silicon dioxide ($SiO_2$), or another material such as, for example, silicon nitride (SiN), siliconborocarbonitride (SiBCN) or titanium dioxide ($TiO_2$). The conformal deposition can be performed using, for example, ALD or CVD.

Figure 20B:
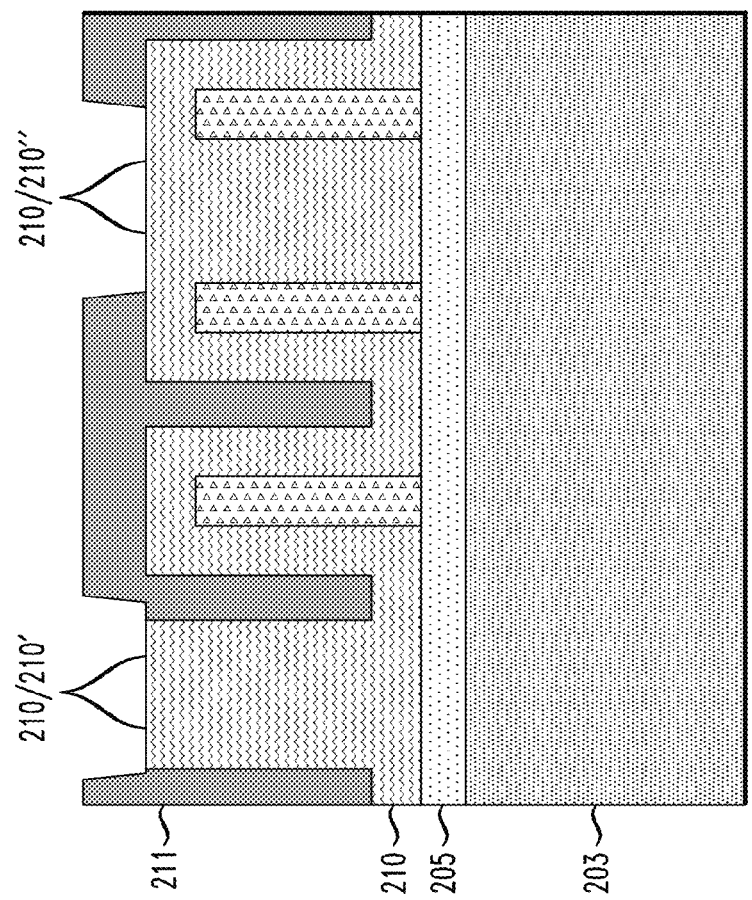
FIG. 20A is a top view and FIG. 20B is a cross-sectional view taken along line T-T' of FIG. 20A illustrating fabrication of a semiconductor device and showing removal of portions of the first and second cut fill material layers, according to an exemplary embodiment of the present invention.
Figure 20A:
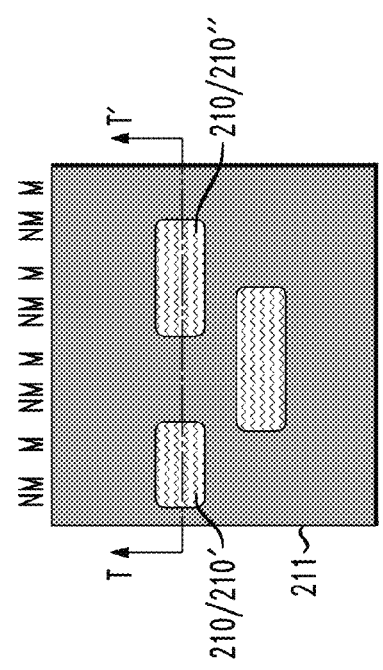

FIG. 20A is a top view and FIG. 20B is a cross-sectional view taken along line T-T' of FIG. 20A illustrating fabrication of a semiconductor device and showing removal of portions of the first and second cut fill material layers, according to an exemplary embodiment of the present invention. Referring to FIGS. 20A and 20B, portions of the first and second cut fill material layers 210', 210" are removed from previously filled opening 235, and a portion of previously filled opening 245. According to an embodiment of the present invention, a directional top-down etching process is performed to selectively remove the portions of the first and second cut fill material layers 210', 210" with respect to the blockout fill material 211. The directional etching can be performed by, for example, an anisotropic etching process, such as, for example RIE. According to an embodiment, the first and second cut fill material layers 210', 210" include the same material, or at least a material in the same class as each other so that both the first and second cut fill material layers 210', 210" can be simultaneously selectively etched with respect to other layers.

Figure 21B:
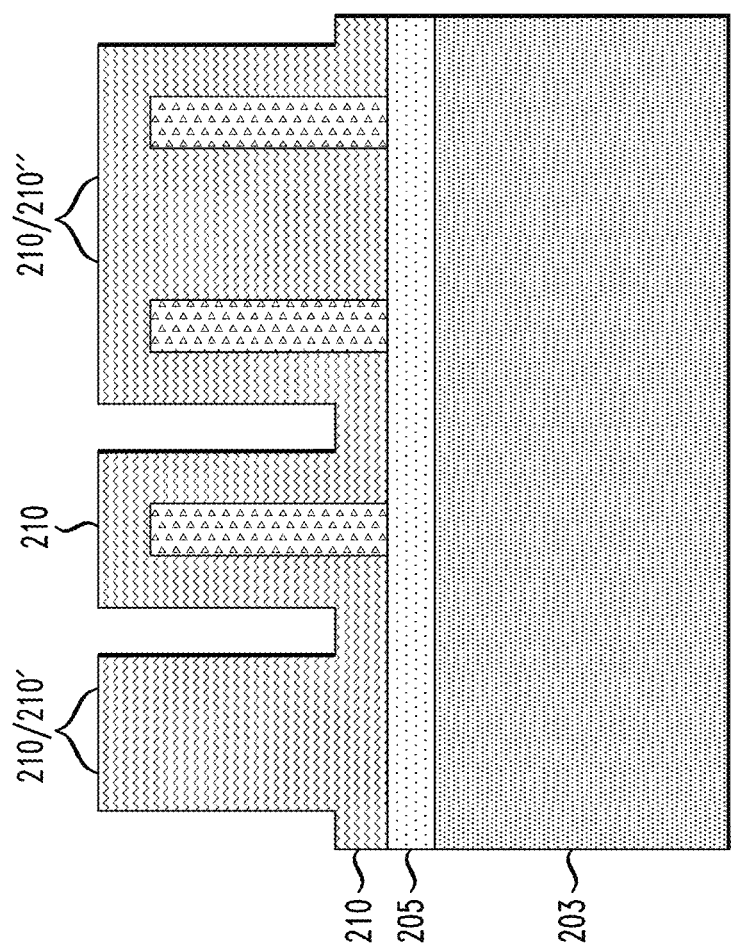
FIG. 21A is a top view and FIG. 21B is a cross-sectional view taken along line U-U' of FIG. 21A illustrating fabrication of a semiconductor device and showing removal of the blockout fill material layer, according to an exemplary embodiment of the present invention.
Figure 21A:
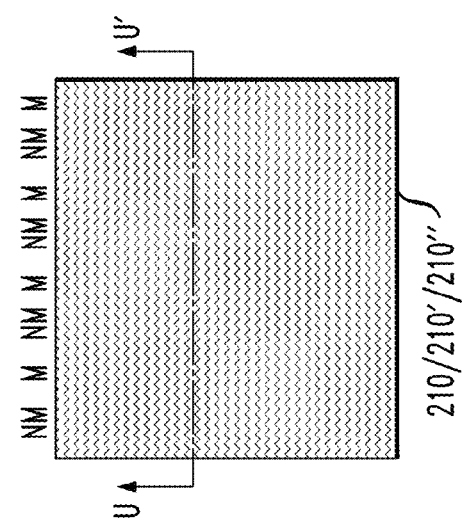

FIG. 21A is a top view and FIG. 21B is a cross-sectional view taken along line U-U' of FIG. 21A illustrating fabrication of a semiconductor device and showing removal of the blockout fill material layer, according to an exemplary embodiment of the present invention. Referring to FIGS. 21A and 21B, the fill material layer 211 is stripped using, for example, oxygen plasma, nitrogen plasma, hydrogen plasma or other carbon strip process. The stripping causes minimal or no damage to the spacer or first and second cut fill material layers 210, 210', 210".

Figure 22B:
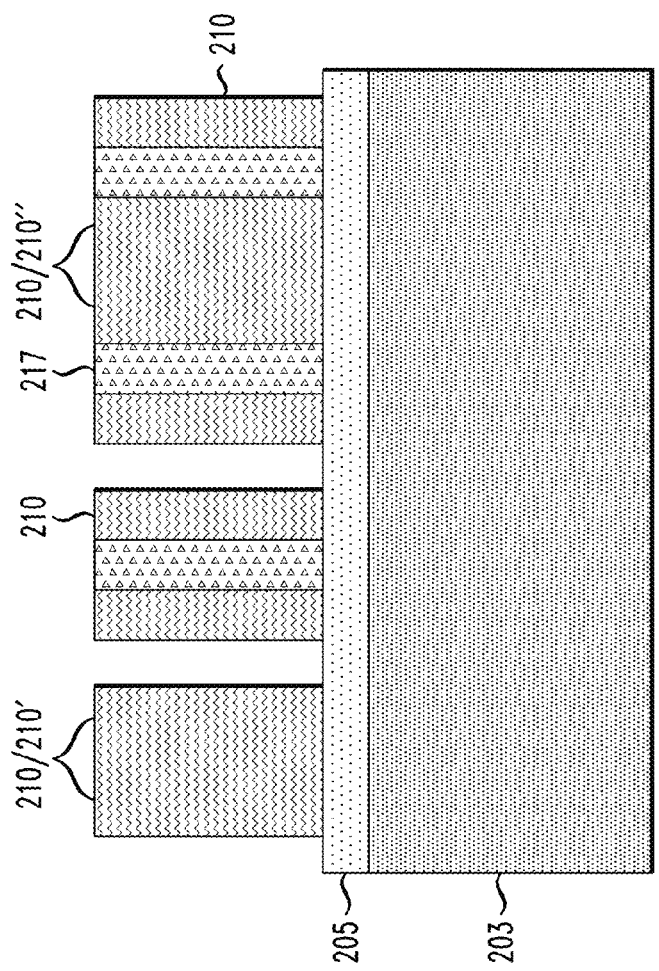
FIG. 22A is a top view and FIG. 22B is a cross-sectional view taken along line V-V' of FIG. 22A illustrating fabrication of a semiconductor device and showing removal of portions of spacer material and of portions of the first and second cut fill material layers, according to an exemplary embodiment of the present invention.
Figure 22A:
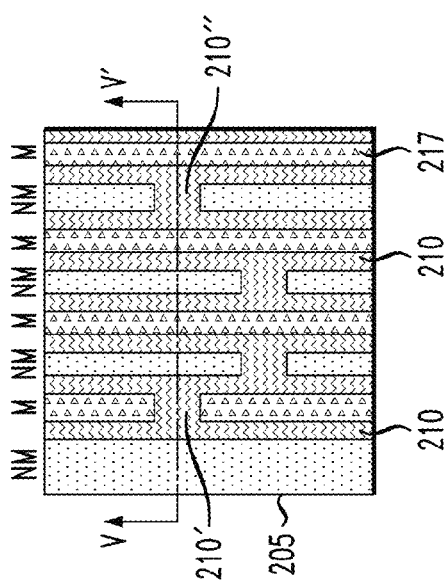

FIG. 22A is a top view and FIG. 22B is a cross-sectional view taken along line V-V' of FIG. 22A illustrating fabrication of a semiconductor device and showing removal of portions of spacer material and of portions of the first and second cut fill material layers, according to an exemplary embodiment of the present invention. Referring to FIGS. 22A and 22B, a directional top-down etching process is performed to remove horizontal portions of the spacer layer 210 from the surface of the hardmask 105 and from a top surface of the mandrels 217, and horizontal portions of the first and second cut fill material layers 210', 210" adjacent the removed portions of the spacer layer 210. The directional etching can be performed by, for example, an anisotropic etching process, such as, for example RIE. According to an embodiment, the spacer and the first and second cut fill material layers 210, 210', 210" include the same material, or at least a material in the same class as each other so that the spacer and the first and second cut fill material layers 210, 210', 210" can be simultaneously selectively etched with respect to other layers.

Figure 23B:
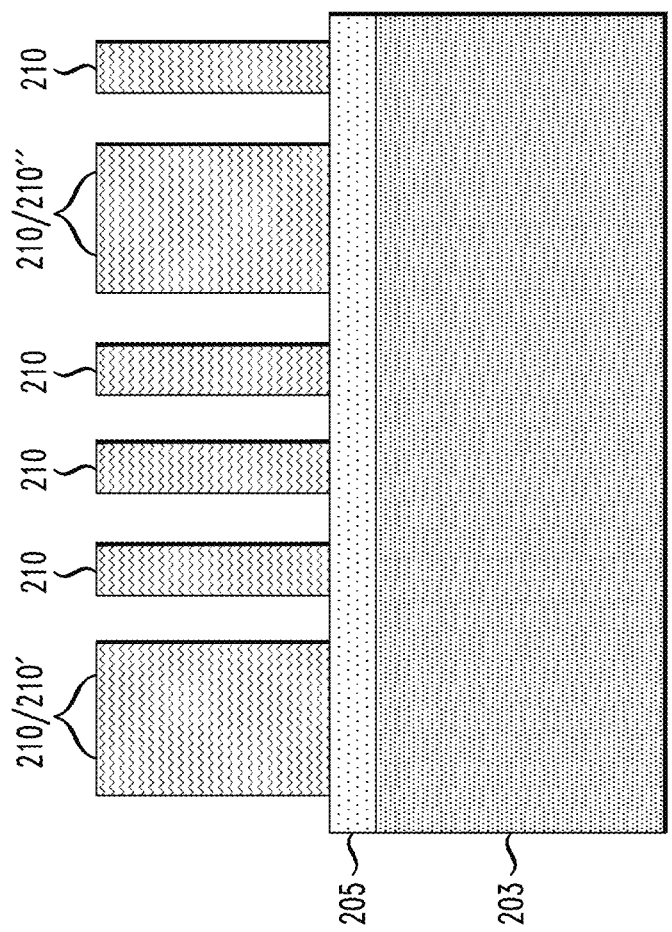
FIG. 23A is a top view and FIG. 23B is a cross-sectional view taken along line W-W' of FIG. 23A illustrating fabrication of a semiconductor device and showing removal of mandrels, according to an exemplary embodiment of the present invention.
Figure 23A:
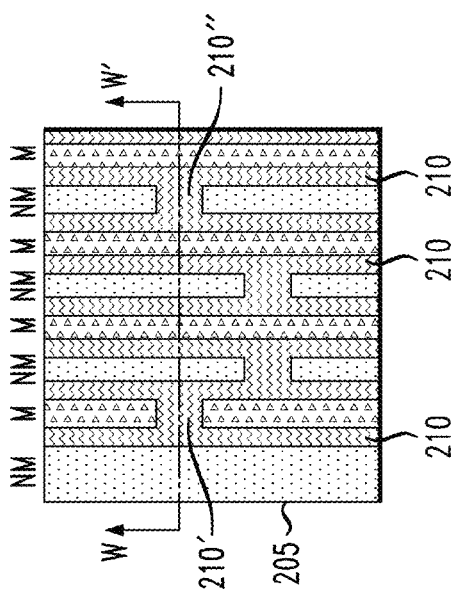

FIG. 23A is a top view and FIG. 23B is a cross-sectional view taken along line W-W' of FIG. 23A illustrating fabrication of a semiconductor device and showing removal of mandrels, according to an exemplary embodiment of the present invention. Referring to FIGS. 23A and 23B, the mandrels 217 are removed by etching the mandrels 217 selective to the material of the spacer and the first and second cut fill material layers 210, 210', 210" and the hardmask material 205. According to an embodiment, the mandrels 217 are removed from between the spacers 210 as shown to expose portions of the hardmask layer 205 that were under the mandrels 217. The mandrels 217 are removed using, for example, an ashing process containing oxygen plasma to strip amorphous carbon or poly mandrel materials. As can be understood, in accordance with an embodiment of the present invention, the spacer and the first and second cut fill material layers 210, 210', 210" include the same material, or at least a material in the same class as each other so that the mandrels 217 need only be selectively removed with respect to two materials, the material of the hardmask 205, and the material of the spacer and the first and second cut fill material layers 210, 210', 210".

Figure 24B:
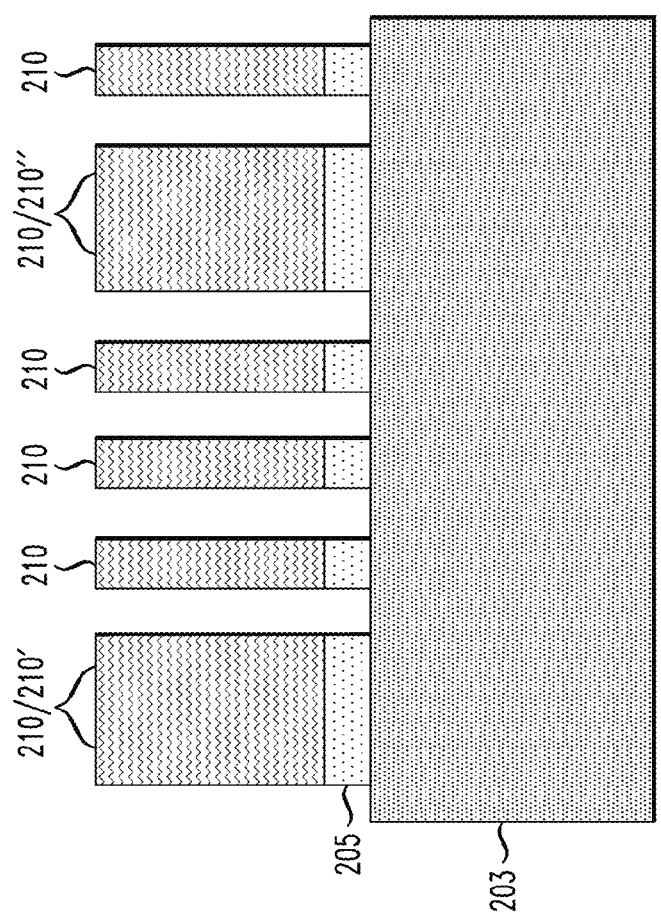
FIG. 24A is a top view and FIG. 24B is a cross-sectional view taken along line X-X' of FIG. 24A illustrating fabrication of a semiconductor device and showing and removal of portions of the mask layer, according to an exemplary embodiment of the present invention.
Figure 24A:
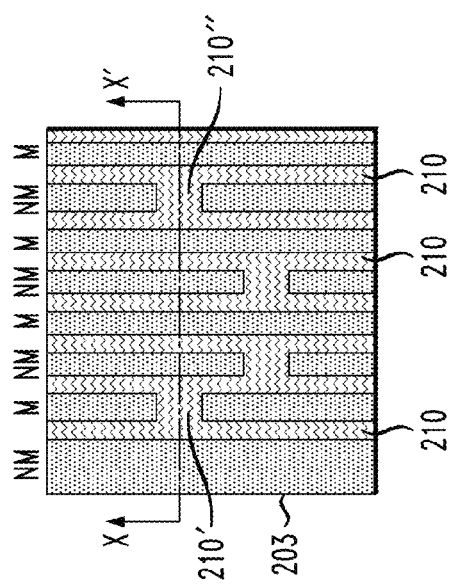

FIG. 24A is a top view and FIG. 24B is a cross-sectional view taken along line X-X' of FIG. 24A illustrating fabrication of a semiconductor device and showing and removal of portions of the mask layer, according to an exemplary embodiment of the present invention. Referring to FIGS. 24A and 24B, the exposed portions of the hardmask layer 205, for example, TiN, not under the spacer and the first and second cut fill material layers 210, 210', 210", are selectively etched with respect to the spacer and the first and second cut fill material layers 210, 210', 210", using, for example, RIE. As can be understood, in accordance with an embodiment of the present invention, the spacer and the first and second cut fill material layers 210, 210', 210" include the same material, or at least a material in the same class as each other so that the exposed portions of the hardmask layer 205 need only be selectively removed with respect to two materials, the material of the dielectric 203, and the material of the spacer and the first and second cut fill material layers 210, 210', 210".

Figure 24C:
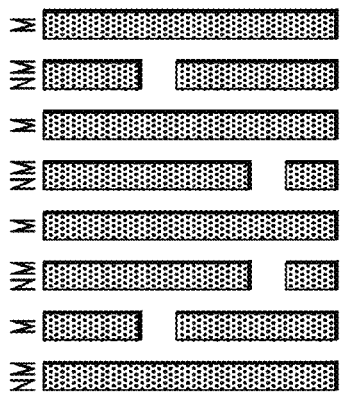
FIG. 24C is a top schematic view showing a designed pattern including mandrel and non-mandrel portions, according to an exemplary embodiment of the present invention.

FIG. 24C is a top schematic view showing a designed pattern including mandrel and non-mandrel portions, according to an exemplary embodiment of the present invention. Referring to FIGS. 24A and 24C, the resulting pattern of lines in FIG. 24A, including non-mandrel (NM) and mandrel (M) portions, corresponds to the pattern of lines in FIG. 24C.

In accordance with an embodiment of the present invention, the resulting patterns shown in FIGS. 10A and 10B, and in FIGS. 24A and 24B are used for patterning trenches in the underlying dielectric layers 103, 203. For example, the patterns of the hardmasks 105, 205 can be used to mask portions of the corresponding dielectric layers 103, 203 to form trenches therein at line widths defined by the patterns of the masks 105, 205. According to an embodiment, additional via patterning can be performed to allow via connections to prior interconnect levels. According to an embodiment, the trenches can be filled with conductive material in a metallization step for subsequent BEOL contact processing. However, as noted above, the embodiments of the present invention are not necessarily limited BEOL processing, and may include other applications, such as, for example, MOL, FEOL or other interconnects.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming a plurality of mandrels on a dielectric layer;
   conformally depositing a spacer layer on the plurality of mandrels;
   removing a portion of the spacer layer from a top surface of at least one of the plurality of mandrels;
   removing the at least one of the plurality of mandrels to create at least one opening;
   filling the at least opening with a cut fill material, wherein the cut fill material comprises the same material as a material of the spacer layer; and
   forming a hardmask layer between the dielectric layer and the plurality of mandrels.

2. The method according to claim 1, wherein the material of the spacer layer and the cut fill material comprise at least one of silicon dioxide ($SiO_2$), or another material such as, for example, silicon nitride (SiN), siliconborocarbonitride (SiBCN) or titanium dioxide ($TiO_2$).

3. The method according to claim 1, further comprising selectively etching a portion of the hardmask layer simultaneously with respect to the spacer layer and the cut fill material.

4. A method for manufacturing a semiconductor device, comprising:
   forming a plurality of mandrels on a dielectric layer;
   conformally depositing a spacer layer on the plurality of mandrels;
   removing a portion of the spacer layer from a top surface of at least one of the plurality of mandrels;
   removing the at least one of the plurality of mandrels to create at least one opening;
   filling the at least opening with a cut fill material, wherein the cut fill material comprises the same material as a material of the spacer layer;
   depositing an organic fill material in the at least one opening and around a remaining portion of the spacer layer prior to filling the at least one opening with the cut fill material; and
   removing the organic fill material from the at least one opening.

5. The method according to claim 4, further comprising stripping a remainder of the organic fill material.

6. A method for manufacturing a semiconductor device, comprising:
   forming a plurality of mandrels on a dielectric layer;
   conformally depositing a spacer layer on the plurality of mandrels;
   removing a portion of the spacer layer from a top surface of at least one of the plurality of mandrels;
   removing the at least one of the plurality of mandrels to create at least one opening;
   filling the at least opening with a cut fill material, wherein the cut fill material comprises the same material as a material of the spacer layer; and
   depositing an organic fill material on the conformally deposited spacer layer prior to removing the portion of the spacer layer from the top surface of the at least one of the plurality of mandrels.

7. The method according to claim 6, further comprising:
   patterning the organic fill material to create an opening in the organic fill material exposing the portion of the spacer layer on the top surface of the at least one of the plurality of mandrels.

8. The method according to claim 7, further comprising filling the opening in the organic fill material with the cut fill material.

9. The method according to claim 8, further comprising:
   patterning the organic fill material to create another opening in the organic fill material exposing another portion of the spacer layer; and
   filling the other opening in the organic fill material with additional cut fill material.

10. The method according to claim 9, wherein the additional cut fill material comprises the same material as a material of the spacer layer and the cut fill material.

11. The method according to claim 10, further comprising:
    removing a portion of the cut fill material and a portion of the additional cut fill material to expose the organic fill material; and
    selectively removing the organic fill material simultaneously with respect to a remaining portion of the spacer layer, the cut fill material and the additional cut fill material.

12. A method for manufacturing a semiconductor device, comprising:
    forming a hardmask layer on a dielectric layer;
    depositing an organic layer on the hardmask layer;
    patterning the organic layer into a plurality of mandrels;
    conformally depositing a spacer layer on the plurality of mandrels;
    removing a portion of the spacer layer from a top surface of at least one of the plurality of mandrels;
    removing the at least one of the plurality of mandrels to create at least one opening;
    filling the at least opening with a cut fill material, wherein the cut fill material comprises the same material as a material of the spacer layer; and
    selectively etching a portion of the hardmask layer simultaneously with respect to the spacer layer and the cut fill material.

13. The method according to claim 12, further comprising:
    depositing an organic fill material in the at least one opening and around a remaining portion of the spacer layer prior to filling the at least opening with the cut fill material; and
    removing the organic fill material from the at least one opening.

14. The method according to claim 13, further comprising stripping a remainder of the organic fill material.

15. The method according to claim 12, further comprising:
    depositing an organic fill material on the conformally deposited spacer layer prior to removing the portion of the spacer layer from the top surface of the at least one of the plurality of mandrels.

16. The method according to claim 15, further comprising:

patterning the organic fill material to create an opening in the organic fill material exposing the portion of the spacer layer on the top surface of the at least one of the plurality of mandrels.

17. The method according to claim 16, further comprising filling the opening in the organic fill material with the cut fill material.

18. A method for manufacturing a semiconductor device, comprising:
   forming a plurality of mandrels spaced apart from each other on a dielectric layer;
   conformally depositing a spacer layer on the plurality of mandrels, wherein the spacer layer occupies a portion of each of a plurality of gaps between adjacent mandrels;
   depositing an organic fill material on the spacer layer, wherein the organic fill material blocks one or more of the plurality of gaps; and
   depositing a cut fill material in a remaining portion of one or more exposed gaps of the plurality of gaps, wherein the cut fill material comprises the same material as a material of the spacer layer.

19. The method according to claim 18, further comprising stripping the organic fill material.

* * * * *